United States Patent
Gritsenko et al.

(10) Patent No.: US 10,826,532 B2
(45) Date of Patent: Nov. 3, 2020

(54) METHODS AND APPARATUS FOR POLAR ENCODING

(71) Applicant: Huawei Technologies Co., Ltd., Shenzhen (CN)

(72) Inventors: Vladimir Gritsenko, Moscow (RU); Aleksei Eduardovich Maevskii, Moscow (RU); Hejia Luo, Hangzhou (CN); Jian Wang, Hangzhou (CN); Rong Li, Hangzhou (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 16/383,322

(22) Filed: Apr. 12, 2019

(65) Prior Publication Data

US 2019/0238159 A1    Aug. 1, 2019

Related U.S. Application Data

(63) Continuation of application No. PCT/CN2017/097274, filed on Aug. 11, 2017.

(30) Foreign Application Priority Data

Jun. 16, 2017  (WO) ............... PCT/CN2017/088757

(51) Int. Cl.
*H03M 13/00* (2006.01)
*H03M 13/13* (2006.01)
(Continued)

(52) U.S. Cl.
CPC ....... *H03M 13/13* (2013.01); *H03M 13/3761* (2013.01); *H03M 13/616* (2013.01);
(Continued)

(58) Field of Classification Search
CPC ........... H03M 13/3761; H03M 13/616; H03M 13/6306; H03M 13/6362; H03M 13/27;
(Continued)

(56) References Cited

U.S. PATENT DOCUMENTS

2015/0092886 A1    4/2015  Ionita et al.
2016/0294418 A1   10/2016  Huang et al.
(Continued)

FOREIGN PATENT DOCUMENTS

CN    105680883 A    6/2016
CN    105811998 A    7/2016
(Continued)

OTHER PUBLICATIONS

"Channel Coding for PBCH," 3GPP TSG RAN WG1 Meeting #88bis, R1-1704249, Spokane, USA, XP051242401, 3rd Generation Partnership Project—Valbonne, France (Apr. 3-7, 2017).
(Continued)

*Primary Examiner* — Guerrier Merant
(74) *Attorney, Agent, or Firm* — Leydig, Voit & Mayer, Ltd.

(57) ABSTRACT

A method to explicitly indicate the version information while still supporting soft combining is disclosed. A polar code encoder maps q bits to q positions of q sub-channels, q is a positive integer; wherein the q bits are used to indicate a version of encoded codeword; map 1 to a special frozen bit corresponding to the q bits; map K−q information bits to K−q positions for the K−q information bits, K is an integer, K>q; and perform polar encoding over an input vector $u_0^{N-1}$, comprising the q bits, the special frozen bit and the K−q information bits, with the length of N, N is an integer, N>=K. With this method, there is no need to make blind detection to achieve the version information of transmitted payload, which reduces power consumption for a receiver.

18 Claims, 14 Drawing Sheets

(51) Int. Cl.
  *H04L 1/00*   (2006.01)
  *H03M 13/37*  (2006.01)
  *H04L 1/18*   (2006.01)

(52) U.S. Cl.
  CPC ... *H03M 13/6306* (2013.01); *H03M 13/6362* (2013.01); *H04L 1/00* (2013.01); *H04L 1/0061* (2013.01); *H04L 1/1812* (2013.01)

(58) Field of Classification Search
  CPC ............ H03M 13/2906; H03M 13/13; H03M 13/6356; H03M 13/2778; H04L 1/00; H04L 1/0061; H04L 1/0041; H04L 1/0067; H04L 1/0057; H04L 1/0071
  See application file for complete search history.

(56) References Cited

U.S. PATENT DOCUMENTS

| | | | |
|---|---|---|---|
| 2016/0308643 A1 | 10/2016 | Li et al. | |
| 2018/0351581 A1* | 12/2018 | Presman | H04L 1/0057 |
| 2019/0158226 A1* | 5/2019 | Hui | H04L 1/0057 |
| 2019/0334659 A1* | 10/2019 | Ye | H04L 1/0057 |
| 2020/0099471 A1* | 3/2020 | Ye | H03M 13/6362 |

FOREIGN PATENT DOCUMENTS

| | | |
|---|---|---|
| CN | 106027071 A | 10/2016 |
| WO | 2015006947 A1 | 1/2015 |
| WO | 2015096021 A1 | 7/2015 |
| WO | 2017054164 A1 | 4/2017 |

OTHER PUBLICATIONS

"Chairman's Notes of Agenda Item 7.1.4 Channel coding," 3GPP TSG RAN WG1 Meeting #89, R1-1709681, Hangzhou, China, XP051285450, 3rd Generation Partnership Project—Valbonne, France (May 15-19, 2017).

"Polar code for PBCH and soft combining," 3GPP TSG RAN WG1 Meeting 90bis, R1-1718373, Prague, Czech Republic, XP051341555, 3rd Generation Partnership Project—Valbonne, France (Oct. 9-13, 2017).

Huawei, HiSilicon, "Soft-combining for PBCH", 3GPP TSG RAN WG1 Meeting #89, R1-1708158, Hangzhou, China, May 15-19, 2017, 9 pages.

Arikan, "Channel Polarization: A Method for Constructing Capacity-Achieving Codes for Symmetric Binary-Input Memoryless Channels", IEEE Transactions on Information Theory, 55 (7): 3051-3073 (2009).

Huawei, HiSilicon, "Overview of Polar Codes", 3GPP TSG RAN WG1 Meeting #84bis, R1-162161, Busan, Korea, Apr. 11-15, 2016, 7 pages.

Huawei, HiSilicon, "Polar codes—encoding and decoding", 3GPP TSG RAN WG1, Meeting #xx, R1-164039, Nanjing, China, May 23-27, 2016, 7 pages.

* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix} \quad G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

Fig. 1

 — frozen (always equal 0)
 — special frozen (always equal 1)
 — information (for version information)
 — information (not for version information)
Fig. 5

Legend for T_u:

▒ special frozen (are fixed to 1)

■ Informational (for time stamp)

Fig. 6 (k)

Legend for T_u:

▒ special frozen (are fixed to 1)

■ Informational (for time stamp)

Fig. 6 (l)

METHODS AND APPARATUS FOR POLAR ENCODING

CROSS-REFERENCE TO RELATED APPLICATIONS

This application is a continuation of International Application No. PCT/CN2017/097274, filed on Aug. 11, 2017, which claims priority to Chinese Patent Application No. PCT/CN2017/088757, filed on Jun. 16, 2017. The disclosures of the aforementioned applications are hereby incorporated by reference in their entireties.

FIELD

The present disclosure relates generally to communications and, in particular, to polar encoding.

BACKGROUND

Polar codes are proposed as channel codes for use in future wireless communications, and have been selected for uplink and downlink enhanced mobile broadband (eMBB) control channel coding for the new $5^{th}$ Generation (5G) air interface, also known as the 5G New Radio (NR). These codes are competitive with state-of-the-art error correction codes and have low encoding complexity. See E. Arikan, "Channel polarization: A method for constructing capacity-achieving codes for symmetric binary-input memoryless channels," IEEE Trans. Inf. Theory, vol. 55, no. 7, pp. 3051-3073, 2009. Successive cancellation list (SCL) decoding is one option for decoding polar coded information.

Based on channel polarization, Arikan designed a channel code that is proven to reach channel capacity. Polarization refers to a coding property that, as code length increases to infinity, bit-channels polarize and their capacities approach either zero (completely noisy channel) or one (completely perfect channel). The fraction of perfect bit-channels is equal to the capacity of a channel.

In Long Term Evolution (LTE) communication system, physical broadcast channel (PBCH) carries main information block (MIB). The MIB information encoded by cascading cyclic redundancy check (CRC) and tailing bit convolution coding (TBCC) and then duplicated to obtain four PBCH segments of equal size. These four PBCH segments are scrambled by four scrambling sequences respectively. Each segment may be decoded independently or jointly decoded with other segments. It should be noted that the Polar code referred to in the present application includes but is not limited to: CRC cascade Polar code, Parity Check cascade Polar code, Arikan traditional Polar code and CRC aided Polar code.

In 5G, with a new frame structure, at least four copies/versions of PBCH may be needed to be soft combined to improve the detection performance in case any joint decoding. Hence, it is interesting how to indicate the version number.

SUMMARY

Illustrative embodiments are disclosed to provide a polar code encoding method and apparatus by way of example in the description and claims. The proposed method and apparatus can explicitly inform the version information of transmitted payload to a receiver.

According to a first aspect, an embodiment of the present disclosure provides a polar code encoding method, by a polar code encoder, comprising:
  mapping q bits to q positions of q sub-channels, q is a positive integer; wherein the q bits are used to indicate a version of encoded codeword;
  mapping 1 to a special frozen bit corresponding to the q bits;
  mapping K−q information bits to K−q positions for the K−q information bits, K is an integer, K>q; and
  performing polar encoding over an input vector $u_0^{N-1}$, comprising the q bits, the special frozen bit and the K−q information bits, with the length of N, N is an integer, N>=K.

With this method, the version information of transmitted payload while keeping these versions still able to be soft combined is explicitly informed to a receiver. In addition, with this explicit indication of version information, no blind detection is needed in the receiver, which reduces a lot of power consumption.

In a first possible embodiment, with reference to the first aspect, the q positions are originally for information bits.

In a second possible embodiment, with reference to the first aspect or the first possible embodiment of the first aspect, Cyclic Redundancy Check (CRC) does not take place over these q bits.

In a third possible embodiment, with reference to the first aspect or the first or the second possible embodiment of the first aspect, with X>1 special frozen bits, the smallest reliability for positions carrying the version information corresponding to the special frozen bit is more than the smallest reliability for positions corresponding to any of the other X−1 special frozen bits.

In a fourth possible embodiment, with reference to the first aspect or the first to the third possible embodiment of the first aspect, the X−1 special frozen bits are scrambled by part of or full of a Radio Network Temporary Identity (RNTI) or any other signature information of a user equipment (UE) or a cell. That can help to identify a transmission target.

In a fifth possible embodiment, with reference to the first aspect or the first to the fourth possible embodiment of the first aspect, $T_u$ is replaced by $T_2^{2i-1}$, $i \in \{1, \ldots, \beta/2\}$ and $\beta$ is the order number of $T_u$; or, $P_x$ is replaced by $P_x^{2i-1}$, $i \in \{1, \ldots, \beta/2\}$ and $\beta$ is the order number of $P_x$.

In a sixth possible embodiment, with reference to the first aspect or the first to the fifth possible embodiment of the first aspect, the encoder is in a base station or a UE.

According to a second aspect, an embodiment of the present disclosure provides a polar code encoding apparatus, comprising:
  mapping module, configured to map q bits to q positions of q sub-channels, q is a positive integer, wherein the q bits are used to indicate a version of encoded codeword, map 1 to a special frozen bit corresponding to the q bits, and map K−q information bits to K−q positions for the K−q information bits, K is an integer, K>q; and
  encoding module, configured to perform polar encoding over an input vector $u_0^{N-1}$, comprising the q bits, the special frozen bit and the K−q information bits, with the length of N, N is an integer, N>=K.

In a first possible embodiment, with reference to the second aspect, the q positions are originally for information bits.

In a second possible embodiment, with reference to the second aspect or the first possible embodiment of the second aspect, Cyclic Redundancy Check (CRC) does not take place over these q bits.

In a third possible embodiment, with reference to the second aspect or the first or the second possible embodiment of the second aspect, with X>1 special frozen bits, the smallest reliability for positions carrying the version information corresponding to the special frozen bit is more than the smallest reliability for positions corresponding to any of the other X−1 special frozen bits.

In a fourth possible embodiment, with reference to the second aspect or the first to the third possible embodiment of the second aspect, the X−1 special frozen bits are scrambled by part of or full of a Radio Network Temporary Identity (RNTI) or any other signature information of a UE or a cell. That can help to identify a transmission target.

In a fifth possible embodiment, with reference to the second aspect or the first to the fourth possible embodiment of the second aspect, $T_u$ is replaced by $T_u^{2i-1}$, $i \in \{1, \ldots, \beta/2\}$ and $\beta$ is the order number of $T_u$; or, $P_x$ is replaced by $P_x^{2i-1}$, $i \in \{1, \ldots, \beta/2\}$ and $\beta$ is the order number of $P_x$.

In a sixth possible embodiment, with reference to the second aspect or the first to the fifth possible embodiment of the second aspect, the apparatus is in a base station or a UE.

According to a third aspect, an embodiment of the present disclosure provides a polar code encoding apparatus, comprising:

a memory comprising instructions; and
a processor coupled to the memory, wherein the instructions cause the processor to be configured to:
map q bits to q positions of q sub-channels, q is a positive integer, wherein the q bits are used to indicate a version of encoded codeword, map 1 to a special frozen bit corresponding to the q bits, and map K−q information bits to K−q positions for the K−q information bits, K is an integer, K>q; and
perform polar encoding over an input vector $u_0^{N-1}$, comprising the q bits, the special frozen bit and the K−q information bits, with the length of N, N is an integer, N>=K.

In a first possible embodiment, with reference to the third aspect, the q positions are originally for information bits.

In a second possible embodiment, with reference to the third aspect or the first possible embodiment of the third aspect, Cyclic Redundancy Check (CRC) does not take place over these q bits.

In a third possible embodiment, with reference to the third aspect or the first or the second possible embodiment of the third aspect, with X>1 special frozen bits, the smallest reliability for positions carrying the version information corresponding to the special frozen bit is more than the smallest reliability for positions corresponding to any of the other X−1 special frozen bits.

In a fourth possible embodiment, with reference to the third aspect or the first to the third possible embodiment of the third aspect, the X−1 special frozen bits are scrambled by part of or full of a Radio Network Temporary Identity (RNTI) or any other signature information of a UE or a cell. That can help to identify a transmission target.

In a fifth possible embodiment, with reference to the third aspect or the first to the fourth possible embodiment of the third aspect, $T_u$ is replaced by $T_u^{2i-1}$, $i \in \{1, \ldots, \beta/2\}$ and $\beta$ is the order number of $T_u$; or, $P_x$ is replaced by $P_x^{2i-1}$, $i \in \{1, \ldots, \beta/2\}$ and $\beta$ is the order number of $P_x$.

In a sixth possible embodiment, with reference to the third aspect or the first to the fifth possible embodiment of the third aspect, the apparatus is in a base station or a UE.

The proposed method and apparatus apply not only to Primary Broadcast Channel (PBCH) transmission, but also to any transmission with the necessity of providing version information, such as Hybrid Automatic Repeat request (HARQ) transmission where the version information is the retransmission identity.

Other aspects and features of embodiments of the present disclosure will become apparent to those ordinarily skilled in the art upon review of the following description.

BRIEF DESCRIPTION OF THE DRAWINGS

Examples of embodiments of the disclosure will now be described in greater detail with reference to the accompanying drawings.

FIG. 1 is a diagram showing one example of how a polar coding generator matrix can be produced from a kernel.

FIG. 5 is an example of selecting positions for special frozen bit, version information bits with N=16.

DETAILED DESCRIPTION

FIG. 1 is a diagram showing, by way of an illustrative example, how a polar coding generator matrix can be produced from a kernel $G_2$ 100. Note that FIG. 1 is an example. Other forms of kernel are also possible. Polarization comes from the "nested" way in which a generator matrix is created from a kernel (or combination of kernels). The 2-fold Kronecker product matrix $G_2^{\otimes 2}$ 102 and the 3-fold Kronecker product matrix $G_2^{\otimes 3}$ 104 in FIG. 1 are examples of polar coding generator matrices. The generator matrix approach illustrated in FIG. 1 can be expanded to produce an m-fold Kronecker product matrix $G_2^{\otimes m}$.

Figure 2:
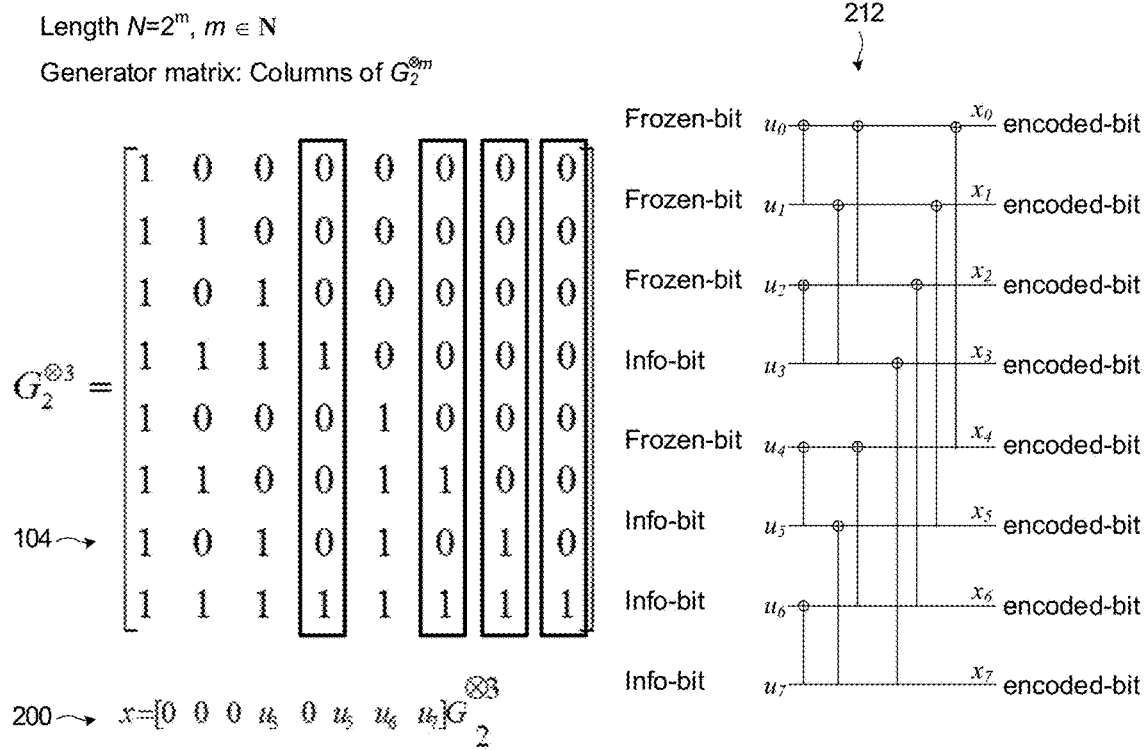
FIG. 2 is a diagram showing an example use of a polar coding generator matrix for producing codewords and a schematic illustration of an example polar code encoder.
Figure 3:
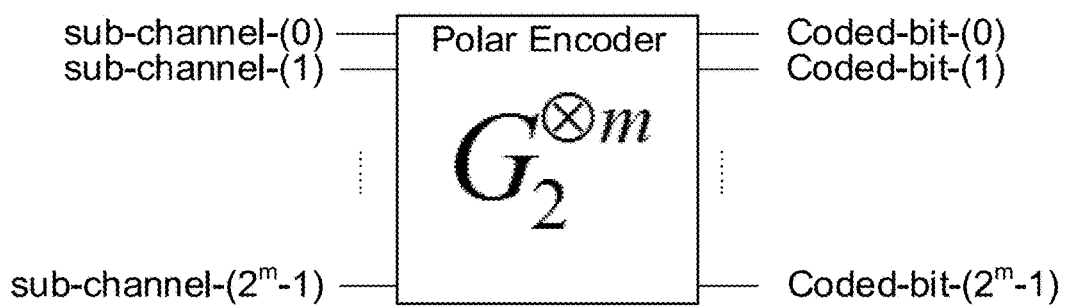
FIG. 3 is a block diagram illustrating an example of a polar code encoder based on a 2-by-2 kernel.

A polar code can be formed from a Kronecker product matrix based on matrix $G_2$ 100. For a polar code having codewords of length $N=2^m$, the generator matrix is $G_2^{\otimes m}$. FIG. 2 is a diagram showing an example use of a polar coding generator matrix for producing codewords and a schematic illustration of an example polar code encoder. In FIG. 2, the generator matrix $G_2^{\otimes 3}$ 104 is used to produce codewords of length $2^3=8$. A codeword x is formed by the product of an input vector u=[0 0 0 $u_3$ 0 $u_5$ $u_6$ $u_7$], sometimes written as $u_0^{N-1}$ to show the index is from 0 to N−1, and the generator matrix $G_2^{\otimes 3}$ 104 as indicated at 200. The input vector u is composed of information bits and fixed or frozen bits. In the specific example shown in FIG. 2, N=8, so the input vector u is an 8-bit vector, and the codeword x is an 8-bit vector. The input vector has frozen bits in positions 0, 1, 2 and 4, and has information bits at positions 3, 5, 6, and 7. An example implementation of an encoder that generates codewords is indicated at 212, where the frozen bits are all set to 0, and the circled "+" symbols represent modulo 2 addition. For the example of FIG. 2, an N=8-bit input vector is formed from K=4 information bits and N−K=4 frozen bits. Codes of this form are referred to as polar codes and the encoder is referred to as a polar code encoder. Decoders for decoding polar codes are referred to as polar decoders. Frozen bits are set to zero in the example shown in FIG. 2. However, frozen bits could be set to other bit values that are known to both an encoder and a decoder. For ease of description, all-zero frozen bits are considered herein, and may be generally preferred.

As it known, polar coding may be performed with or without bit reversal. The example polar code encoder in FIG. 2 is without bit reversal.

Generally, the output of a polar code encoder can be expressed as $x_0^{N-1} = u_0^{N-1} G_N$, where, without bit reversal, $G_N = F^{\otimes n}$ is an N-by-N generator matrix, $N=2^n$, $n \geq 1$. (For example, for n=1 (indicated as 100 in FIG. 1), $G_2 = F$. For bit reversal, $G_N = B_N F^{\otimes n}$, where $B_N$ is an N-by-N bit-reversal permutation matrix.

Embodiments disclosed herein could be implemented without or with bit reversal.

In polar code construction, ideally the more "reliable" positions of an input vector are used to carry the information bits, and the more "unreliable" positions of an input vector are used to carry the frozen bits (i.e., bits already known to both encoder and decoder). However, when information is transmitted over a physical channel, the reliability of a given bit position is also a function of the characteristics of the physical channel, such as the erasure rate of the physical channel. A reliability sequence (reliable and unreliable positions) could be calculated based on assumed or measured characteristics of the physical channel before the information is transmitted over the channel, for example. In theory, the frozen bits can be set to any value as long as the location and value of each frozen bit is known to both the encoder and the decoder. In conventional applications, the frozen bits are all set to zero.

With a sufficiently long code length, a code designed according to polarization theory can reach the channel capacity in a binary memoryless channel if a Successive Cancellation (SC) decoding algorithm is used. A very simple SC decoding algorithm was analyzed and simulated by Arikan.

In practice, a code length cannot be infinite and a channel cannot be a binary memoryless channel, and therefore channel capacity cannot be reached by such a simple SC decoder. According to Arikan, the channel capacity can be approached when using SC decoding if a code length is over $2^{20}$ bits in an additive white Gaussian noise (AWGN) channel. Such a long code length is impractical in wireless communications, for example.

Assistant or error-detecting code (EDC) bits can be included in the input vector to assist in decoding. A cyclic redundancy check (CRC) code could be used as an EDC. More than one EDC could be used within one codeword. However, it should be understood that other EDCs, such as a checksum code or a Fletcher Code, may be used. Some EDCs are also error-correcting codes (ECCs).

CRC bits, for example, are generated based on the information bits being transmitted. CRC bits are generally placed in more reliable positions in the input vector, although CRC bits may also or instead be placed in other positions in the input vector. CRC bits may be used in path selection for List decoding, for example, to improve polar code performance.

During encoding, an N-bit input vector could be formed from K information bits including one or more CRC bits, and (N−K) frozen bits. In this example, starting with a number of input bits, a CRC is calculated and appended to the input bits to produce a set of information bits including the input bits and the CRC bits. The remaining (N−K) frozen bits are inserted to produce an N-bit input vector, where N is a power of 2 in an Arikan polar code. The input vector is then multiplied by a generator matrix for a polar code to produce an N-bit codeword.

The codeword is transmitted over a channel, and a receiver, in turn, receives a word. Due to channel effects such as noise, the received word might not be identical to the transmitted codeword. A decoder attempts to decode the received word to determine information bits in the original input vector.

During decoding of a codeword encoded from an input vector, the locations and values of frozen bits in the input vector are treated as known. For descriptive simplicity, bits of the input vector that are not known to the decoder in advance will be referred to as "unknown" bits. For example, the information bits including any CRC bits are unknown bits. Some polar decoders use SC decoding as noted above, in which the unknown bits are decoded sequentially and successive cancellation is applied. Once a particular decision has been made regarding how an unknown bit is to be decoded, SC polar decoders do not allow that bit to be changed or corrected, and the decoder moves on to decoding the next unknown bit.

Another type of polar decoding algorithm with greater space efficiency, referred to as a List decoder, is described in "List Decoding of Polar Codes" by Tal and Vardy, *Proceedings of the* 2011 *IEEE International Symposium on Information Theory*, pp. 1-5 (July 2011). In a List decoder, successive levels of a binary decision tree are generated, each level corresponding to a decision on a respective unknown bit. Each path in the decision tree from the root node to leaf nodes represents a possible partial decoded sequence of unknown bits and has a corresponding likelihood. During generation of the decision tree, at each level of the decision tree where the number of paths grows beyond a set threshold L, the L paths having the highest likelihoods are identified, and the remaining paths are discarded. If the codeword includes encoded CRC bits for the previous information bits, then once the decision tree is generated, each of the surviving paths that corresponds to decoded information bits is checked against the CRC bits represented in each of those surviving paths. The decoder then outputs as a decoded vector the information bits in the surviving path that passes the CRC check. If more than one path passes the CRC check, then the decoder selects for output the path that passes the CRC check and has the highest likelihood, which may be determined according to a metric. If no path passes the CRC check, or if the codeword does not include encoded CRC bits, then the decoder selects for output the path that has the highest likelihood, which as noted above may be determined according to a metric.

Thus, there are two types of the decoding based on successive cancellation, including SC decoding and List decoding, which is also referred to as SCL decoding. For bit-level decoding, a decoding path generates 2 leaf branches (bit=0|1) for a next decoding bit. An SC decoder tracks only one decoding path. After the value of a decoded bit is estimated, the other possible value is ignored. Decoding continues with the next bit, assuming that each previous bit has been correctly estimated when updating partial sum results.

In an AWGN channel, a polar code in effect divides a channel into N sub-channels. N is referred to as mother code length and is always is power of 2 in an Arikan polar code, which is based on a polar kernel that is a 2-by-2 matrix. A key to code construction for a polar code is to determine which bit-channels, also referred to herein as sub-channels, are selected or allocated for information bits and which sub-channels are allocated for frozen bits. In some embodiments, one or more sub-channels are also allocated to parity check (PC), CRC, and/or other types of bits that are used to assist in decoding. In terms of polarization theory, the sub-channels that are allocated for frozen bits are called frozen sub-channels, the sub-channels that are allocated for information bits are called information sub-channels, and additional assistant sub-channels may be allocated to assistant bits that are used to assist in decoding. In some embodiments, assistant bits are considered to be a form of information bits, for which more reliable sub-channels are selected or allocated.

Figure 4:
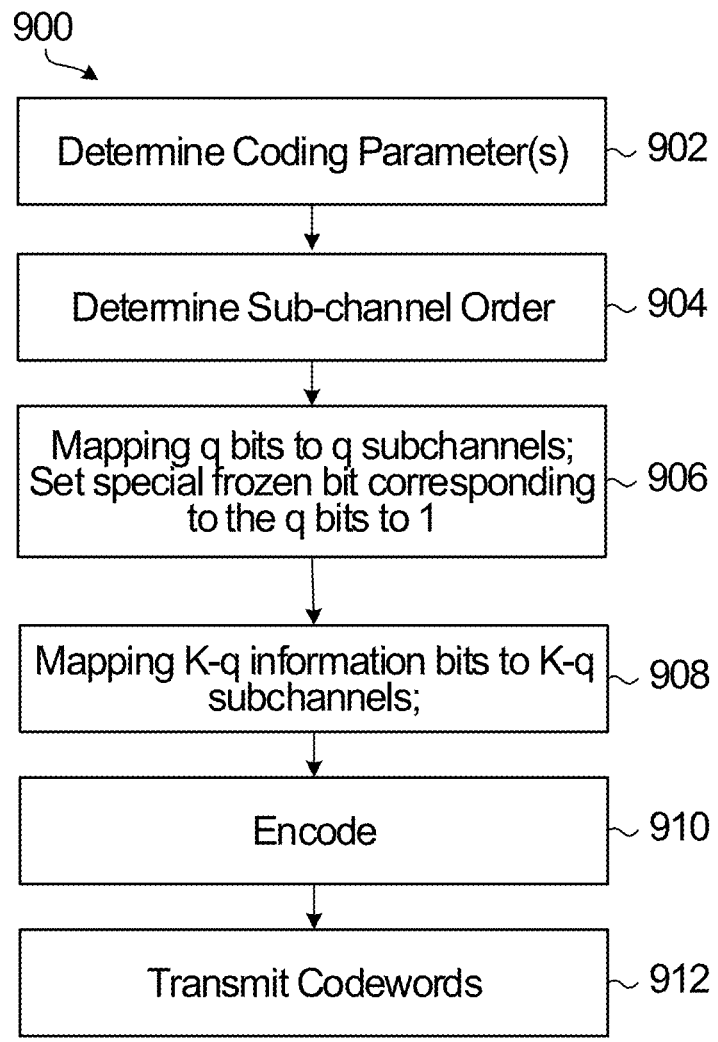
FIG. 4 is a flow diagram of an example coding method according to an embodiment.

Polar encoders based on Kronecker products of a 2-by-2 Arikan kernel $G_2$ are described above. FIG. 4 is a block diagram illustrating an example of a polar code encoder based on a 2-by-2 kernel. Sub-channels and coded bits are labeled in FIG. 4, and a channel is divided into N sub-channels by a polar code as noted above. An information block and frozen bits are allocated onto the N sub-channels, and the resultant N-sized vector is multiplied with an N-by-N Kronecker matrix by the polar code encoder to generate a codeword that includes N coded bits. An information block includes at least information bits and could also include assistant bits such as CRC bits or PC bits. A sub-channel selector could be coupled to the polar code encoder to select at least sub-channels for information bits and any assistant bits, with any remaining sub-channels being frozen sub-channels.

For polar codes that are based on a 2-by-2 kernel and an N-by-N Kronecker matrix, N is a power of 2. This type of kernel and polar codes based on such a kernel are discussed herein as illustrative examples. Other forms of polarization kernels such as prime-number kernels (e.g. 3-by-3 or 5-by-5) or combinations of (prime or non-prime number) kernels to produce higher-order kernels could yield polarization among code sub-channels. It should also be noted that coded bit processing such as puncturing, shortening, zero padding, and/or repetition could be used in conjunction with polar codes that are based on 2-by-2 kernels or other types of kernels, for rate matching and/or other purposes for example.

As a result of SC, SCL, or check-aided successive cancellation list (CA-SCL) decoding, the polarization phenomenon appears over the sub-channels. Some sub-channels have high capacity, and some sub-channels have low capacity. Put another way, some sub-channels have high Signal-to-Noise Ratio (SNR) and others have low SNR. These metrics are examples of characteristics that could be used to quantify or classify sub-channel "reliability". Other metrics indicative of sub-channel reliability can also be used.

Code construction involves determining a code rate (the number of information bits K, or how many sub-channels are to carry information bits) and selecting the particular K sub-channels among the N available sub-channels that are to carry information bits. For ease of reference herein, information bits could include input bits that are to be encoded, and possibly CRC bits, PC bits, other assistant bits that are used to assist in decoding, and/or version information bits to indicate the version of the codeword. Sub-channel selection is based on reliabilities of the sub-channels, and typically the highest reliability sub-channels are selected as information sub-channels for carrying information bits.

Sub-channel reliabilities could be specified, for example, in one or more ordered sequences. A single, nested, SNR-independent ordered sequence of sub-channels could be computed for a code length $N_{max}$, with ordered sequences for shorter code lengths N being selected from the longer $N_{max}$ sequence. Multiple ordered sequences in terms of different mother code lengths $N_i$ could instead be computed, and one of the mother code length sequences could be selected for a particular code based on preferred code length. Another possible option involves computing multiple ordered sequences in terms of SNR values, for example, and selecting an ordered sequence based on measured SNR. The detailed algorithm to obtain the sub-channel reliabilities is out of the scope of this disclosure.

In LTE, the version information of transmitted payload (e.g. PBCH) is implicitly transferred by different CRC masking but it leads to many times of blind detection to obtain the version information, especially when soft combining is adopted. Hence a method to reduce the blind detection tests and explicitly indicate the version information while still supporting soft combining is disclosed herein. With this method, there is no need to make blind detection to achieve the version information of transmitted payload, which reduces a lot of power consumption for a user equipment (UE) or any mobile terminal. This method applies not only to PBCH transmission, but also to any transmission with the necessity of providing version information, such as Hybrid Automatic Repeat request (HARQ) transmission where the version information is the retransmission identity. It can be applied in a base station or a UE or a network device or a mobile terminal.

FIG. 4 is a flow diagram of an example coding method according to an embodiment. The illustrated example method 900 includes determining one or more coding parameters at 902. The coding parameter(s) could include at least a mother code rate N, which could be read from memory or otherwise provided. N could be computed based on a given K and a given code rate R, for example.

At 904, an order of coding sub-channels, i.e., a position of each sub-channel, is determined. A rule set could be used to reduce the number of reliability computations and polynomial comparisons that are involved in determining sub-channel order at 904, for example, which could make it feasible to determine sub-channel order online when information is to be encoded or decoded.

In 906, a polar code encoder mapping q bits to q positions of q sub-channels, wherein q is a positive integer. These q bits are used to indicate a version of encoded codeword. In addition, the polar code encoder maps 1 to a special frozen bit corresponding to the q bits.

The reliability of any of the q positions for the q bits is no less than the reliability of a position for any frozen bit. Or the q positions are originally for information bits. When the q positions are selected to carry q bits to indicate the version number, CRC encoding does not take place over these q bits.

In an ordered sequence, the position of a special frozen bit and the positions of the q bits are closed related.

For example, when q=2, the q bits can be used to indicate 1 to 4 versions of an encoded codeword. The position $j_0$ of the special frozen bit can be any frozen bit position before N/2, i.e., $j_0 \in \{0, 1, \ldots, N/2-1\}$, and the q positions for the q bits $(u_{j_1}, u_{j_2})$ are $j_1=j_0+N/4$ and $j_2=j_0+N/2$. Please note that $j_1$ and $j_2$ are originally for information bits. $j_0$ is a position for a frozen bit, same as originally. With this requirement, it is possible to have X>1 special frozen bits. In an embodiment, among the X special frozen bits, a special frozen bit in position $j_0$ is selected when the smaller reliability for positions $j_1$ and $j_2$ to carry the version information corresponding to $j_0$ is more than the smaller reliability for positions $j_1'$ and $j_2'$ corresponding to any of other X−1 special frozen bits. The special frozen bits are still frozen bits anyway Another example is, when q=4, the q bits can be used to indicate 1 to 8 versions of an encoded codeword. The position $j_0$ of the special frozen bit is $j_0$=i+7·N/16, where i∈{0, 1, . . . , N/16−1}, and the q positions $j_1, j_2, j_3$ and $j_4$ for the q bits $(u_{j_1}, u_{j_2}, u_{j_3}, u_{j_4})$ are: $j_1$=i+11·N/16, $j_2$=i+13·N/16, $j_3$=i+14·N/16, $j_4$=i+15·N/16. Similarly, $j_0$ is a position for a frozen bit, same as originally. $j_1, j_2, j_3$ and $j_4$ are originally for information bits and it is possible to have X>1 special frozen bits. In an embodiment, among the X special frozen bits, a special frozen bit in position $j_0$ is selected when the smallest reliability for positions $j_1, j_2, j_3$ and $j_4$ to carry the version information corresponding to $j_0$ is more than the smallest reliability for positions $j_1', j_2', j_3'$ and $j_4'$ corresponding to any of other X−1 special frozen bits.

When a special frozen bit is selected to carry version information and set to 1, each of the other special frozen bits is free to be fixed to 1 or 0. These special frozen bits can be scrambled by part of or full of a Radio Network Temporary Identity (RNTI) or any other signature information of a UE or a cell to help information identity and identify a transmission target. And all other frozen bits are better to be set to 0.

In 908, the polar code encoder maps K−q information bits to K−q positions for the K−q information bits where K is an integer and K>q.

In 910, the polar code encoder performs polar encoding over an input vector $u_0^{N-1}$ comprising the q bits, the special frozen bit and the K−q information bits, with the length of N, N is the length of a polar code and an integer, N>=K.

It should be noted that the version information can be added before or after the encoding. Connection between $P_x$ and $T_u$ can be expressed by following:

$$\begin{cases} c_0^{N-1} = u_0^{N-1} \cdot G_2^{\otimes m} \\ c_0^{N-1} \cdot P_x = u_0^{N-1} \cdot T_u \cdot G_2^{\otimes m} \end{cases}$$

$P_x$ (permutation in code-domain) can be used to get different versions of codeword $c_0^{N-1}$, $c_0^{N-1} \cdot P_x$, $c_0^{N-1} \cdot P_x^2$, . . . ; they can easily be soft combined). With suitable positions for version information selected from the positions originally for information, the different values in the selected positions to indicate different versions of a codeword can be defined, namely values in positions for version numbers should differs for vectors $u_0^{N-1}$, $u_0^{N-1} \cdot T_u$, $u_0^{N-1} \cdot T_u^2$, . . . .

For q=2, one version of an encoded codeword can be one of following: $c_0^{N-1}$, $u_0^{N-1} \cdot T_u \cdot G_2^{\otimes m}$, $u_0^{N-1} \cdot T_u^2 \cdot G_2^{\otimes m}$, $u_0^{N-1} \cdot T_u^3 \cdot G_2^{\otimes m}$ (before the encoding) or can be one of following: $c_0^{N-1}$, $c_0^{N-1} \cdot P_x$, $c_0^{N-1} \cdot P_x^2$, $c_0^{N-1} \cdot P_x^3$ (after the encoding). They have equivalent effect except the processing procedure, wherein $c_0^{N-1} = u_0^{N-1} \cdot G_2^{\otimes m}$, $T_u$ is a sparse upper-triangular two diagonal matrix and $T_u$ is defined as:

$$T_u = [t_{i,j}]_{i,j=0}^{N-1},$$

$$t_{i,j} = \begin{cases} 1, & i = j \text{ or } j - i = \frac{N}{4} \\ 0, & \text{otherwise} \end{cases}.$$

$P_x$ is a permutation matrix and satisfies:

$$P_x = G_2^{\otimes m} \cdot T_u \cdot G_2^{\otimes m}.$$

FIG. 5 gives an example with N=16 including 9 information bits. The positions for original information set I={6, 7,9,10,11,12,13,14,15} and up to 4 different version can be provided for an encoded codeword. In the example, position {5} is set to carry the selected special frozen bit and set to 1 (marked as 'S' in the Figure). And hence {9,13} are selected to carry the version information (marked as 'V' in the Figure). To simplify the expression, all frozen bits except the selected special frozen bit are set to 0. But it should be noted that at least other special frozen bits can be 1. In this example, there are totally X=3 special frozen bits {2,3,5}, i.e., the frozen bits on position {2,3} can be freely set to 1 or 0 known to the receiver.

Please note that if the q bits $(u_{j_1}, u_{j_2})$ for the first version of the encoded codeword is determined, its following three versions are correspondingly determined. For the example above, if the q bits $(u_{j_1}, u_{j_2})$ for the first version of the encoded codeword is (0,0), the following three versions are represented by (1,0), (0,1) and (1,1) in sequence.

Generally, if a $T_u$ can be used to generate different versions of a codeword, its inverse $T_u^{-1}$ can also be used to generate different versions of a codeword. And the version sequence is also inversed with the same first version. For the example above, if $T_u^{-1}$ is used and the first version is (0,0), the following three versions are represented by (1,1), (0,1) and (1,0) in sequence. For q=2, $T_u^{-1} = T_u^3$.

Similarly, if a $P_x$ can be used to generate different versions of a codeword, its inverse $P_x^{-1}$ can also be used to generate different versions of a codeword. And the version sequence is also inversed with the same first version. For q=2, $P_x^{-1} = P_x^3$.

A practical example of q position and special frozen bit for N=512 is as follows:

TABLE 1

| Payload range | q positions (for N = 512) | Special frozen index (for N = 512) |
|---|---|---|
| 40-74 | $u_{255}$, $u_{383}$ | $u_{127}$ |

For q=4, one version of an encoded codeword can be one of following $c_0^{N-1}$, $u_0^{N-1} \cdot T_u \cdot G_2^{\otimes m}$, $u_0^{N-1} \cdot T_u^2 \cdot G_2^{\otimes m}$, $u_0^{N-1} \cdot T_u^3 \cdot G_2^{\otimes m}$, $u_0^{N-1} \cdot T_u^4 \cdot G_2^{\otimes m}$, $u_0^{N-1} \cdot T_u^5 \cdot G_2^{\otimes m}$, $u_0^{N-1} \cdot T_u^6 \cdot G_2^{\otimes m}$, $u_0^{N-1} \cdot T_u^7 \cdot G_2^{\otimes m}$ (before the encoding) or can be one of following: $c_0^{N-1}$, $c_0^{N-1} \cdot P_x$, $c_0^{N-1} \cdot P_x^2$, $c_0^{N-1} \cdot P_x^3$, $c_0^{N-1} \cdot P_x^4$, $c_0^{N-1} \cdot P_x^5$, $c_0^{N-1} \cdot P_x^6$, $c_0^{N-1} \cdot P_x^7$ (after the encoding). They have equivalent effect except the processing procedure, wherein $c_0^{N-1} = u_0^{N-1} \cdot G_2^{\otimes m}$, $T_u$ is defined as $T_u = [t_{i,j}]_{i,j=0}^{N-1}$ by rules:

If i≡j (mod N/16) then $t_{i,j} = \tau_{s,v}$, where s=[i/16], v=[j/16]

Otherwise $t_{i,j}$=0 wherein $T = [\tau_{s,v}]_{s,v=0}^{15}$ is defined by:

$$T = G_2^{\otimes 4} \cdot P \cdot G_2^{\otimes 4}$$

and P is a permutation matrix of size 16 and order 8. Order 8 means that for any natural number i less than 8 matrix $P^i$ is not identical, but $P^8$ is identical. $P_x$ is defined as:

$$P_x = G_2^{\otimes m} \cdot T_u \cdot G_2^{\otimes m}.$$

Figure 6:
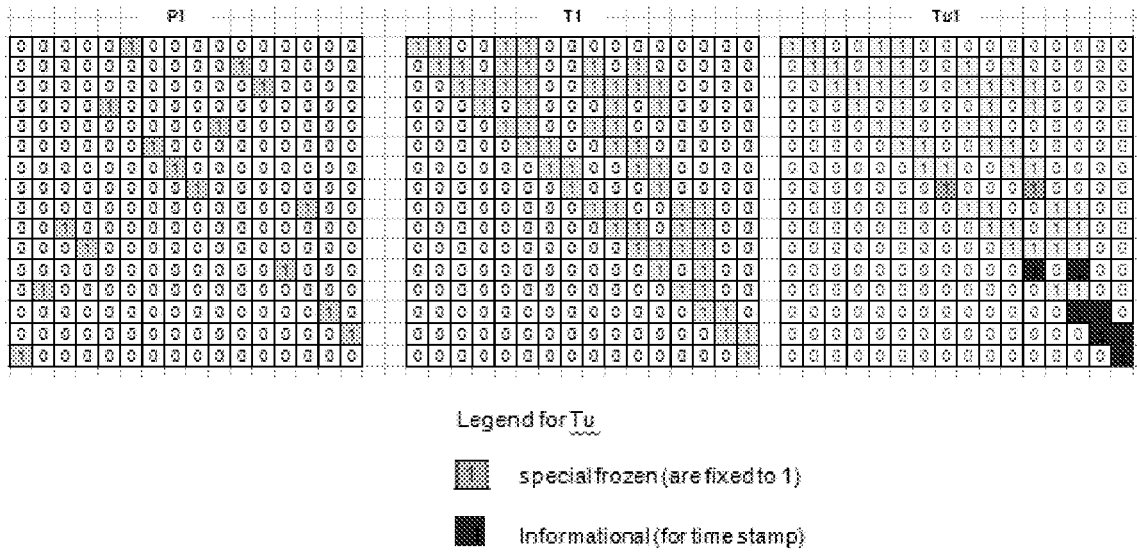
FIG. 6(a) to FIG. 6(p) are examples of P,T,$T_u$ with N=16.
Figure 6:
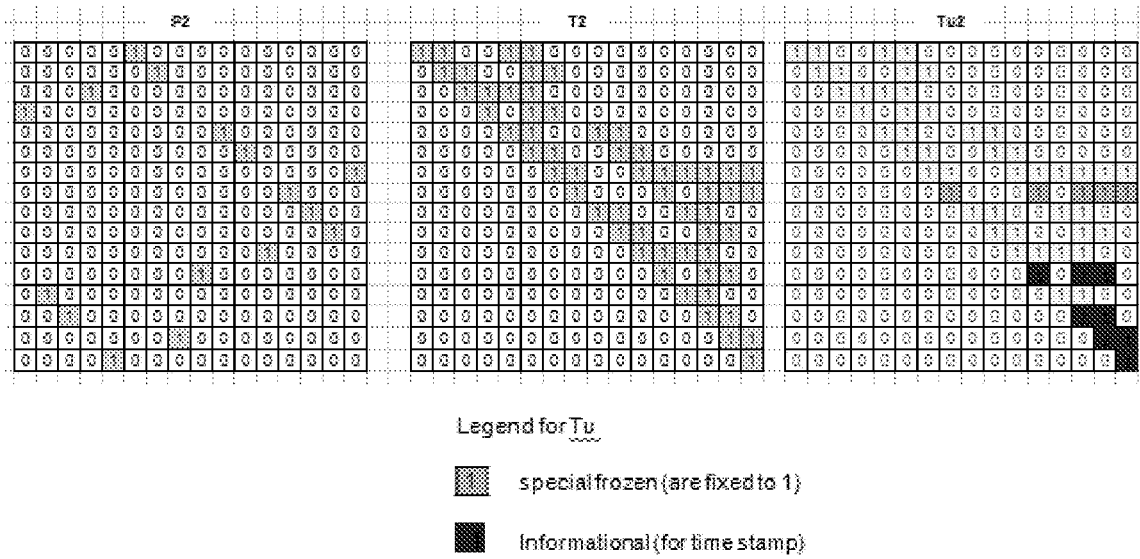
Figure 6:
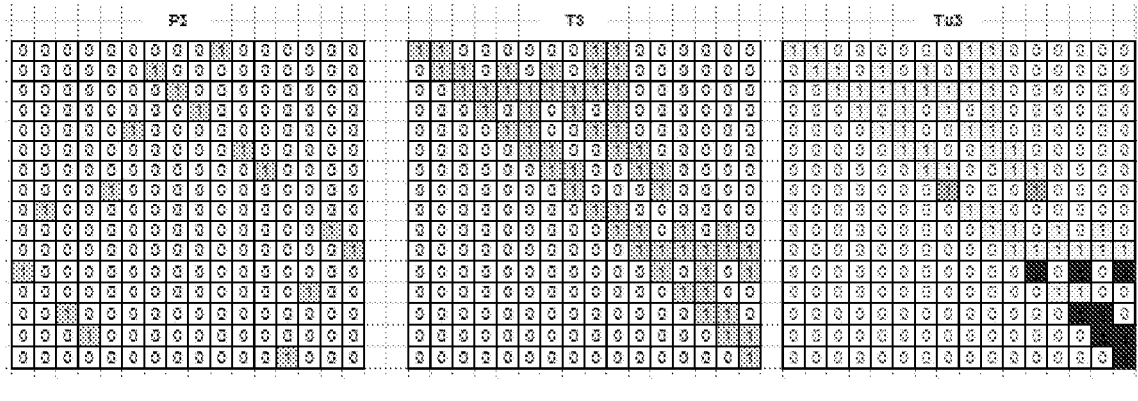
Figure 6:
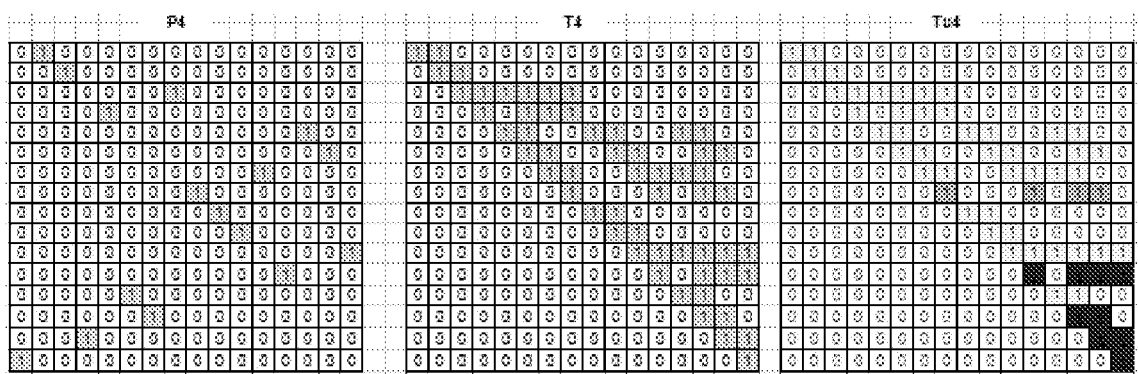
Figure 6:
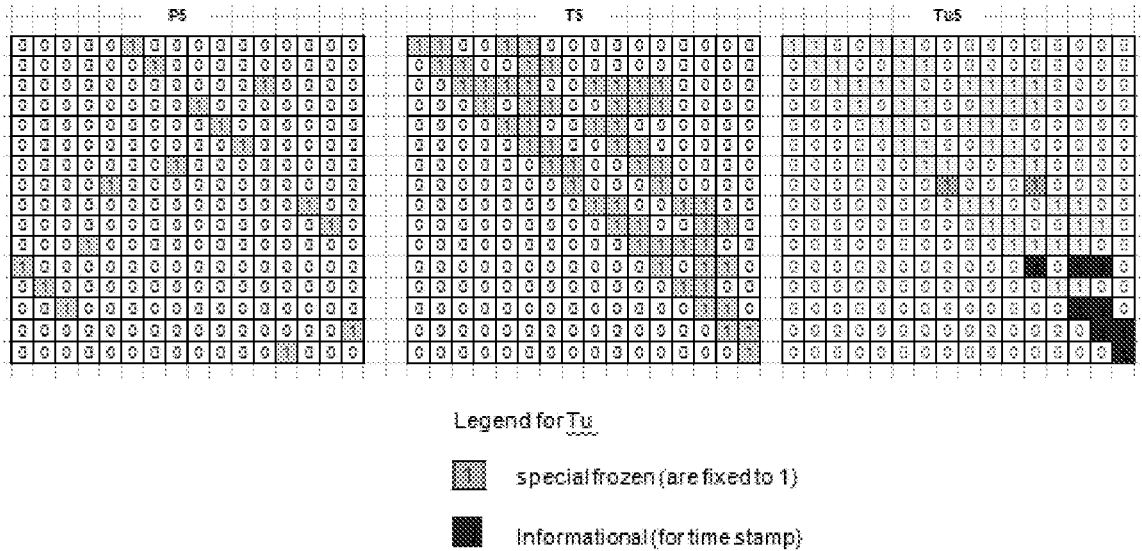
Figure 6:
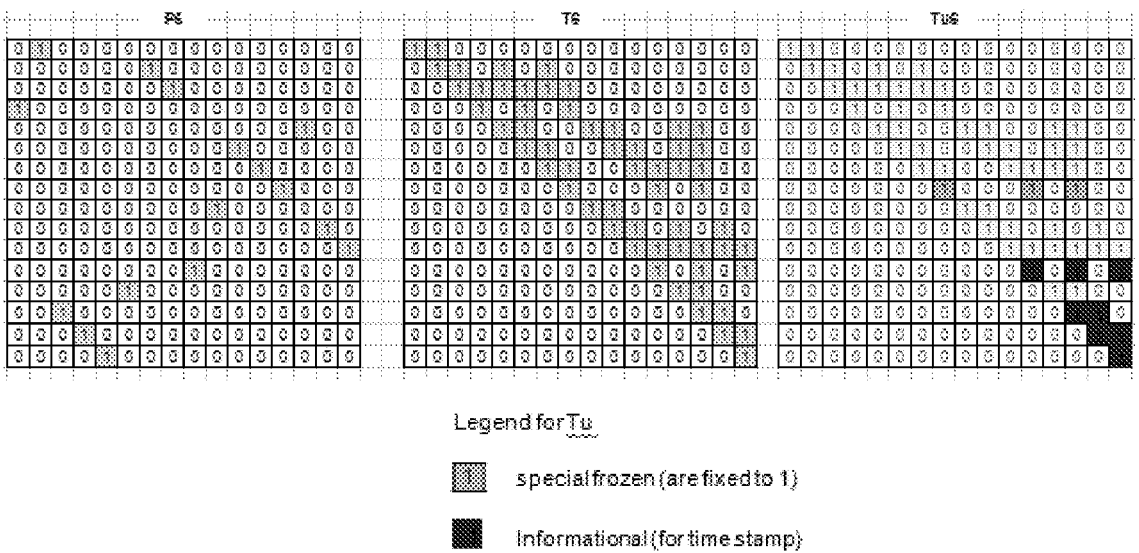
Figure 6:
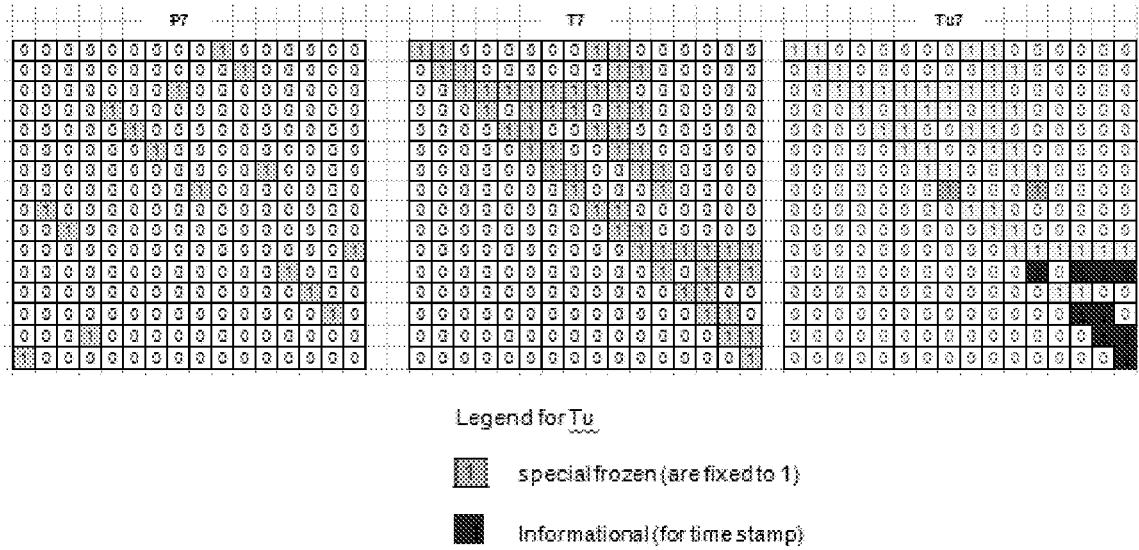
Figure 6:
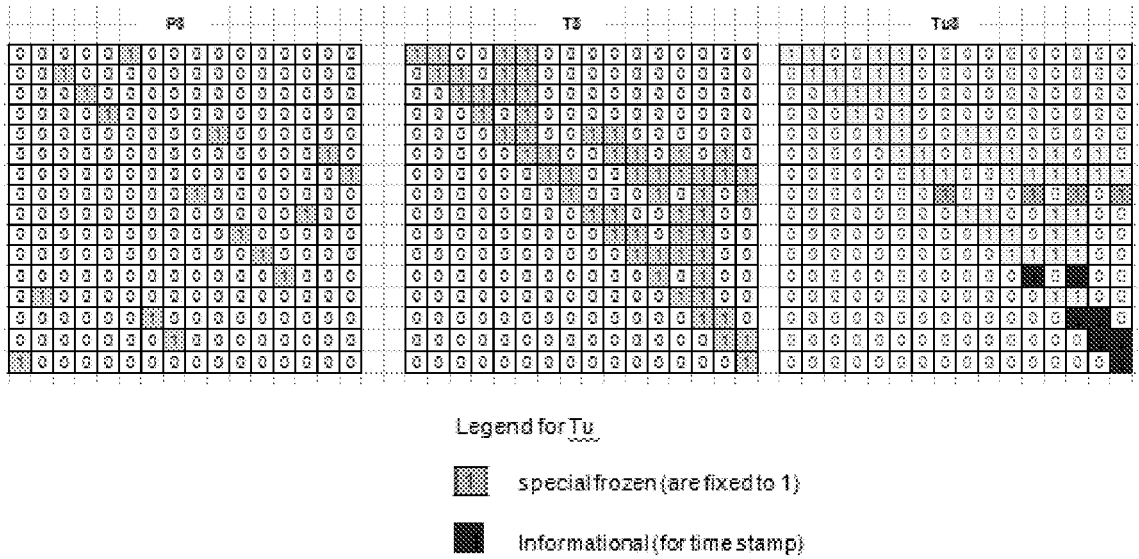
Figure 6:
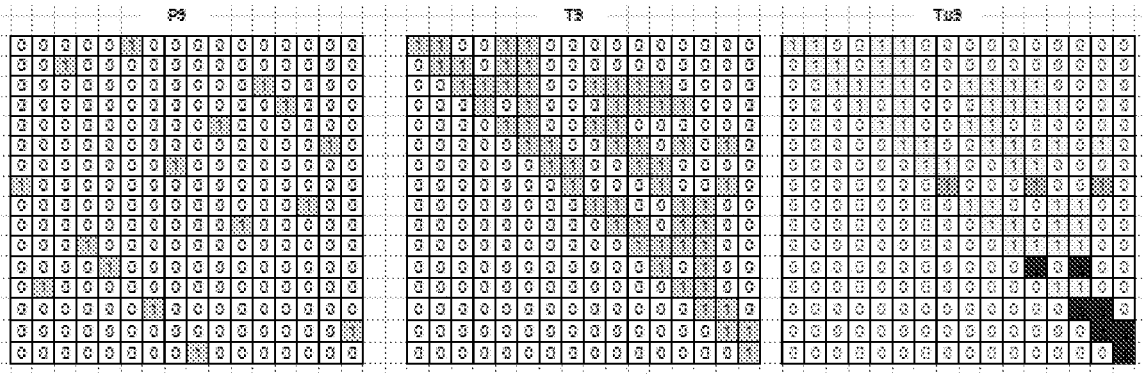
Figure 6:
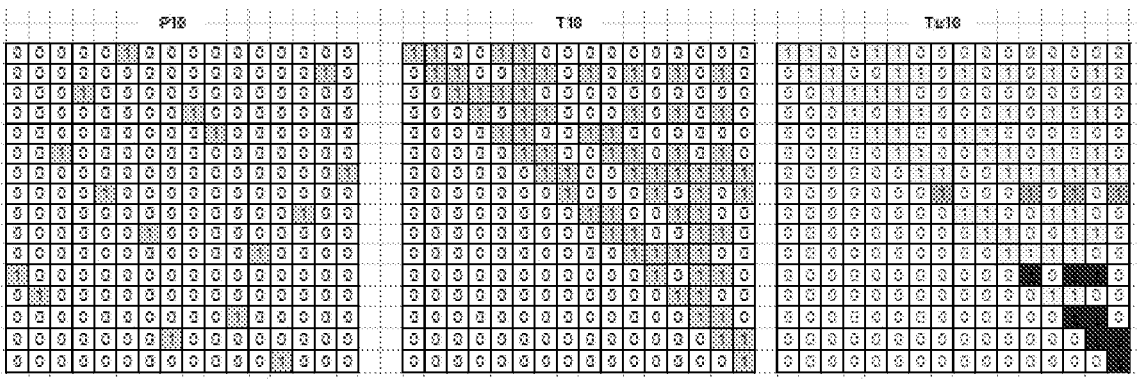
Figure 6:
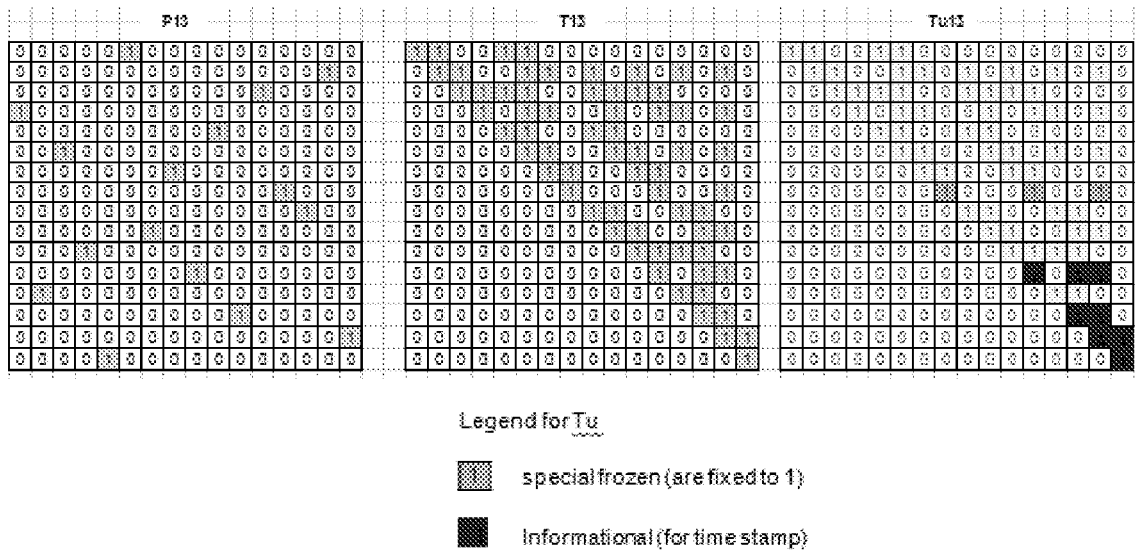
Figure 6:
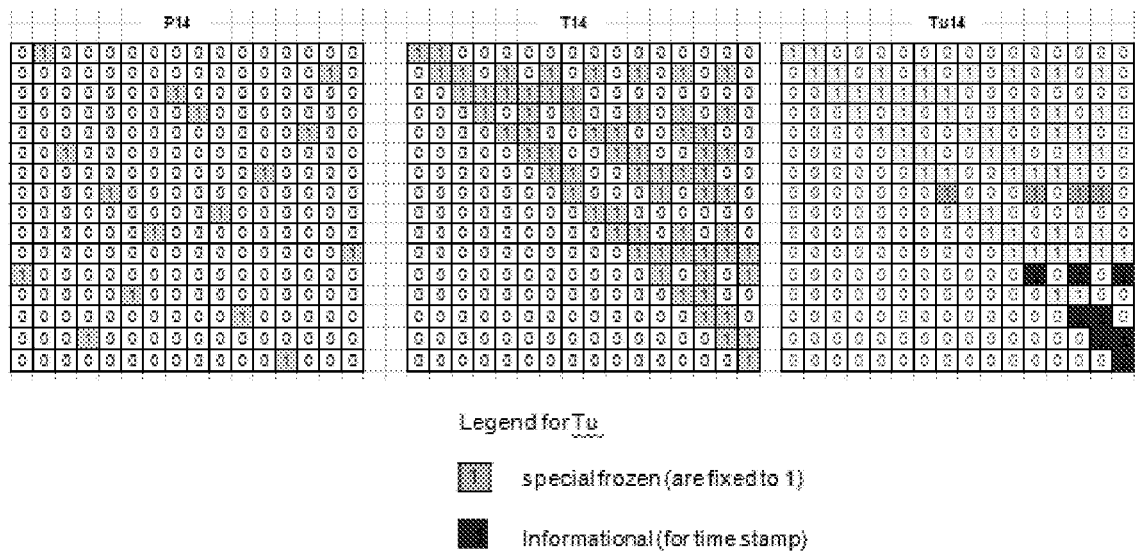
Figure 6:
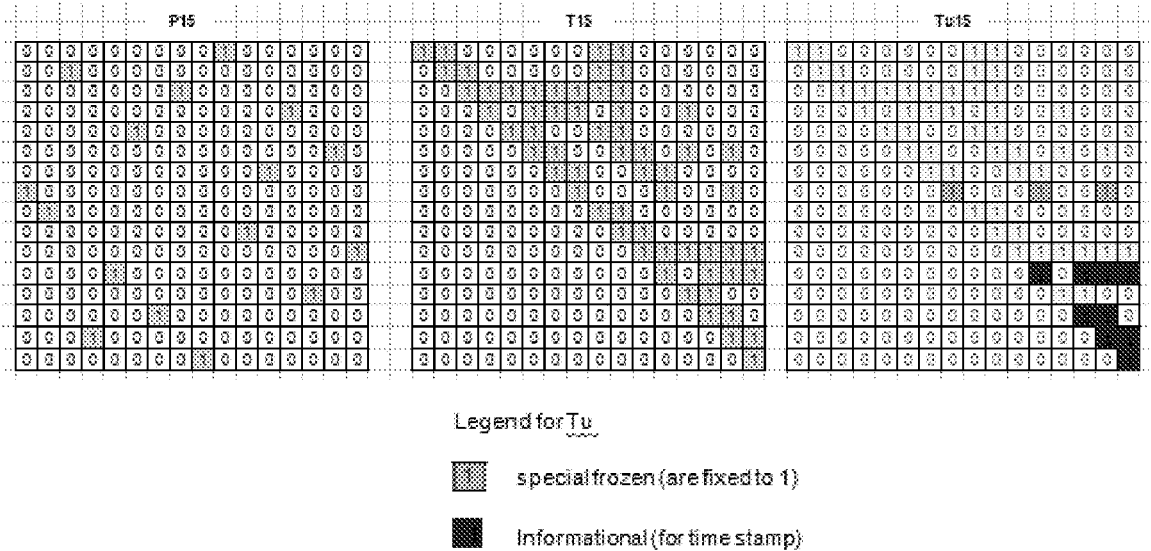
Figure 6:
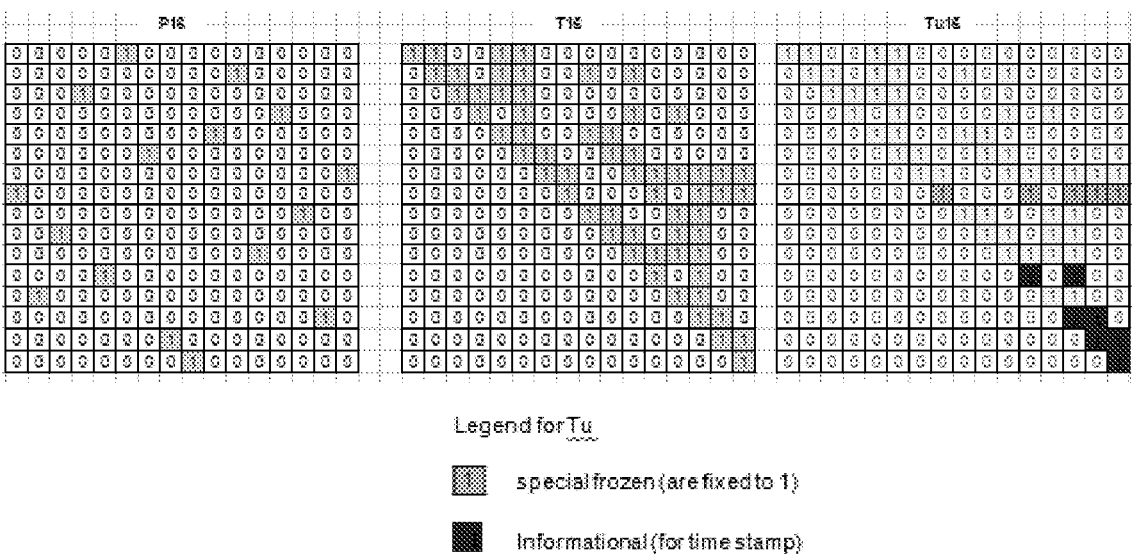

FIG. 6(a) to FIG. 6(p) provides some examples for possible selections of P and T and $T_u$ (N=16), where the position {7} is set to carry the selected special frozen bit and set to 1. And hence {11,13,14,15} are selected to carry the version information. To simplify the expression, all frozen bits except the selected special frozen bit are set to 0. But in practical implementation, they are possible to be set to 1. Again, it should be noted that other special frozen bits are freely set to 1 or 0 known to the receiver. From the figures, it can be found that when N=16, $T_u$ and T are exactly same in each subfigure. That is, T can be directly used as $T_u$ with N=16, and correspondingly $P_x$=P. However, if N>16, any $T_u$ or $P_x$ has to be constructed from T and/or P with size 16 with the method described above.

For a practical case of N=512, a permutation example for 8 version is provided based on the inverse of the P, T as in FIG. 6(a) with the procedure described above. The permutation matrix can be expressed as a permutation sequence as follows:

Sequence 1:
[160 161 162 163 164 165 166 167 168 169 170 171 172 173 174 175 176 177 178 179 180 181 182 183 184 185 186 187 188 189 190 191 320 321 322 323 324 325 326 327 328 329 330 331 332 333 334 335 336 337 338 339 340 341 342 343 344 345 346 347 348 349 350 351 352 353 354 355 356 357 358 359 360 361 362 363 364 365 366 367 368 369 370 371 372 373 374 375 376 377 378 379 380 381 382 383 128 129 130 131 132 133 134 135 136 137 138 139 140 141 142 143 144 145 146 147 148 149 150 151 152 153 154 155 156 157 158 159 288 289 290 291 292 293 294 295 296 297 298 299 300 301 302 303 304 305 306 307 308 309 310 311 312 313 314 315 316 317 318 319 192 193 194 195 196 197 198 199 200 201 202 203 204 205 206 207 208 209 210 211 212 213 214 215 216 217 218 219 220 221 222 223 224 225 226 227 228 229 230 231 232 233 234 235 236 237 238 239 240 241 242 243 244 245 246 247 248 249 250 251 252 253 254 255 256 257 258 259 260 261 262 263 264 265 266 267 268 269 270 271 272 273 274 275 276 277 278 279 280 281 282 283 284 285 286 287 416 417 418 419 420 421 422 423 424 425 426 427 428 429 430 431 432 433 434 435 436 437 438 439 440 441 442 443 444 445 446 447 64 65 66 67 68 69 70 71 72 73 74 75 76 77 78 79 80 81 82 83 84 85 86 87 88 89 90 91 92 93 94 95 96 97 98 99 100 101 102 103 104 105 106 107 108 109 110 111 112 113 114 115 116 117 118 119 120 121 122 123 124 125 126 127 384 385 386 387 388 389 390 391 392 393 394 395 396 397 398 399 400 401 402 403 404 405 406 407 408 409 410 411 412 413 414 415 32 33 34 35 36 37 38 39 40 41 42 43 44 45 46 47 48 49 50 51 52 53 54 55 56 57 58 59 60 61 62 63 448 449 450 451 452 453 454 455 456 457 458 459 460 461 462 463 464 465 466 467 468 469 470 471 472 473 474 475 476 477 478 479 480 481 482 483 484 485 486 487 488 489 490 491 492 493 494 495 496 497 498 499 500 501 502 503 504 505 506 507 508 509 510 511 0 1 2 3 4 5 6 7 8 9 10 11 12 13 14 15 16 17 18 19 20 21 22 23 24 25 26 27 28 29 30 31].

The 0th value in the permutation sequence is 160, which means that after the permutation, the 160th number in the original vector will be in 0th position after permutation.

For another practical case of N=256 based on the inverse of the P, T as in FIG. 6(a) with the procedure described above, the permutation matrix can be expressed as a permutation sequence as follows:

Sequence 2:
[80 81 82 83 84 85 86 87 88 89 90 91 92 93 94 95 160 161 162 163 164 165 166 167 168 169 170 171 172 173 174 175 176 177 178 179 180 181 182 183 184 185 186 187 188 189 190 191 64 65 66 67 68 69 70 71 72 73 74 75 76 77 78 79 144 145 146 147 148 149 150 151 152 153 154 155 156 157 158 159 96 97 98 99 100 101 102 103 104 105 106 107 108 109 110 111 112 113 114 115 116 117 118 119 120 121 122 123 124 125 126 127 128 129 130 131 132 133 134 135 136 137 138 139 140 141 142 143 208 209 210 211 212 213 214 215 216 217 218 219 220 221 222 223 32 33 34 35 36 37 38 39 40 41 42 43 44 45 46 47 48 49 50 51 52 53 54 55 56 57 58 59 60 61 62 63 192 193 194 195 196 197 198 199 200 201 202 203 204 205 206 207 16 17 18 19 20 21 22 23 24 25 26 27 28 29 30 31 224 225 226 227 228 229 230 231 232 233 234 235 236 237 238 239 240 241 242 243 244 245 246 247 248 249 250 251 252 253 254 255 0 1 2 3 4 5 6 7 8 9 10 11 12 13 14 15].

The 0th value in the permutation sequence is 80, which means that after the permutation, the 80th number in the original vector will be in 0th position after permutation.

To be more concise, the above permutation for both N=512 and N=256 can be expressed as an N/16 group-wise permutation with a group-permutation pattern as:

[5 10 11 4 9 6 7 8 13 2 3 12 1 14 15 0].

The 0th value in the group-permutation sequence is 5, which means that after the permutation, the 5th N/16-group in the original will be in 0th N/16-group after permutation. This group-permutation pattern is only related to the P or T in FIG. 6(a). For other N=16 permutation pattern in FIG. 6(b)-FIG. 6(p). Similar procedure can be applied to generate permutation pattern for practical length.

Based on the above permutation pattern based on patterns in FIG. 6(a), several q bits ($u_{j_1}$, $u_{j_2}$, $u_{j_3}$, $u_{j_4}$) and its corresponding special frozen bit are given as follows, which follows the procedure described above. Since the q bit set is from information set, it may depend on the polar construction sequence and payload size. Given the practical permutation pattern, some demonstrative examples are shown in the following tables, where Table 2 to Table 7 are permutation patterns for sequence 3 to sequence 8 respectively:

TABLE 2

| Payload range | i | q positions | Special frozen position |
|---|---|---|---|
| 40-45 | 30 | $u_{382}$, $u_{446}$, $u_{478}$, $u_{510}$ | $u_{254}$ |
| 46-50 | 29 | $u_{381}$, $u_{445}$, $u_{477}$, $u_{509}$ | $u_{253}$ |
| 51-57 | 27 | $u_{379}$, $u_{443}$, $u_{475}$, $u_{507}$ | $u_{251}$ |
| 58-64 | 23 | $u_{375}$, $u_{439}$, $u_{471}$, $u_{503}$ | $u_{247}$ |
| 65-74 | 15 | $u_{367}$, $u_{431}$, $u_{463}$, $u_{495}$ | $u_{239}$ |

Sequence 3, N=512:
[0 1 2 4 8 16 3 32 5 6 9 64 10 17 12 18 128 33 20 34 7 24 36 65 11 256 66 40 13 19 68 14 129 48 21 72 130 35 22 25 132 37 80 26 38 257 67 136 41 28 258 96 69 42 15 144 49 260 70 44 73 131 50 23 264 74 160 133 52 81 27 76 134 39 272 82 137 56 29 259 192 97 138 84 43 30 145 288 98 261 71 140 45 88 146 51 262 100 46 265 75 161 148 53 320 266 104 77 162 135 54 273 83 152 57 268 78 164 274 193 112 139 85 58 31 384 289 194 99 276 168 86 141 60 89 147 290 263 196 101 142 47 280 90 176 149 292 102 321 267 200 105 92 163 150 55 322 153 296 106 269 79 165 275 208 113 154 324 59 270 108 166 385 304 195 114 277 169 87 156 61 328 386 291 224 278 197 170 116 143 62 281 91 177 388 293 198 103 336 172 282 201 120 93 178 151 294 323 392 297 202 107 284 94 180 209 352 155 325 298 271 204 109 167 400 305 210 115 184 326 157 300 110 329 387 306 225 279 212 171 117 158 63 330 416 226 389 308 199 118 337 173 283 216 121 332 179 390 295 228 338 174 393 312 203 122 285 95 181 448 353 394 340 299 232 286 205 124 182 401 211 354 185 327 396 301 206 111 344 402 307 240 213 186 356 159 302 331 417 227 404 309 214 119 188 217 360 333 418 391 310 229 339 175 408 313 218 123 334 420 230 449 368 395 341 314 233 287 220 125 183 450 355 424 342 234 397 316 207 126 345 403 241 452 187 357 398 303 236 346 432 242 405 215 358 189 456 361 348 419 406 311 244 190 409 219 362 335 421 231 464 369 410 315 248 221 364

422 451 370 425 343 235 412 317 222 127 480 453 426 372
399 318 237 347 433 243 454 359 428 238 457 376 349 434
407 245 191 458 363 350 436 246 465 411 249 460 365 423
466 371 440 250 413 223 366 481 468 427 373 414 319 252
482 455 374 429 239 472 377 435 484 430 459 378 351 437
247 488 461 380 438 467 441 251 462 367 496 469 442 415
253 483 470 375 444 254 473 485 431 474 379 486 489 476
381 439 490 463 382 497 443 492 498 471 445 255 500 446
475 487 504 477 491 478 383 493 499 494 501 447 502 505
506 479 508 495 503 507 509 510 511].

TABLE 3

| Payload range | i | q positions | Special frozen position |
|---|---|---|---|
| 40-45 | 7 | $u_{183}, u_{215}, u_{231}, u_{247}$ | $u_{119}$ |
| 46-57 | 12 | $u_{188}, u_{220}, u_{236}, u_{252}$ | $u_{124}$ |
| 58-62 | 10 | $u_{186}, u_{218}, u_{234}, u_{250}$ | $u_{122}$ |
| 63-67 | 9 | $u_{185}, u_{217}, u_{233}, u_{249}$ | $u_{121}$ |
| 68-70 | 6 | $u_{182}, u_{214}, u_{230}, u_{246}$ | $u_{118}$ |
| 71-74 | 5 | $u_{181}, u_{213}, u_{229}, u_{245}$ | $u_{117}$ |

Sequence 4, N=256:
[0 1 2 4 8 16 3 32 5 6 9 64 10 17 12 18 128 33 20 34 7 24
36 65 11 66 40 13 19 68 14 129 48 21 72 130 35 22 25 132
37 80 26 38 67 136 41 28 96 69 42 15 144 49 70 44 73 131
50 23 74 160 133 52 81 27 76 134 39 82 137 56 29 192 97
138 84 43 30 145 98 71 140 45 88 146 51 100 46 75 161 148
53 104 77 162 135 54 83 152 57 78 164 193 112 139 85 58
31 194 99 168 86 141 60 89 147 196 101 142 47 90 176 149
102 200 105 92 163 150 55 153 106 79 165 208 113 154 59
108 166 195 114 169 87 156 61 224 197 170 116 143 62 91
177 198 103 172 201 120 93 178 151 202 107 94 180 209
155 204 109 167 210 115 184 157 110 225 212 171 117 158
63 226 199 118 173 216 121 179 228 174 203 122 95 181
232 205 124 182 211 185 206 111 240 213 186 159 227 214
119 188 217 229 175 218 123 230 233 220 125 183 234 207
126 241 187 236 242 215 189 244 190 219 231 248 221 235
222 127 237 243 238 245 191 246 249 250 223 252 239 247
251 253 254 255].

TABLE 4

| Payload range | i | q positions | Special frozen position |
|---|---|---|---|
| 40-42 | 30 | $u_{382}, u_{446}, u_{478}, u_{510}$ | $u_{254}$ |
| 43-51 | 29 | $u_{381}, u_{445}, u_{477}, u_{509}$ | $u_{253}$ |
| 52-58 | 27 | $u_{379}, u_{443}, u_{475}, u_{507}$ | $u_{251}$ |
| 59-68 | 15 | $u_{367}, u_{431}, u_{463}, u_{495}$ | $u_{239}$ |
| 69-74 | 28 | $u_{380}, u_{444}, u_{476}, u_{508}$ | $u_{252}$ |

Sequence 5, N=512:
[0 1 2 4 8 16 32 3 5 64 9 6 17 10 18 128 12 33 65 20 256
34 24 36 7 129 66 11 40 68 130 19 13 48 14 72 257 21 132
35 258 26 80 37 25 22 136 260 264 38 96 67 41 144 28 69
42 49 74 272 160 288 192 70 44 131 81 50 73 15 320 133
52 23 134 384 76 137 82 56 27 97 39 259 84 138 145 261
29 43 98 88 140 30 146 71 262 265 161 45 100 51 148 46
75 266 273 104 162 53 193 152 77 164 268 274 54 83 57
112 135 78 289 194 85 276 58 168 139 99 86 60 280 89 290
196 141 101 147 176 142 321 31 200 90 292 322 263 149
102 105 304 296 163 92 47 267 385 324 208 386 150 153
165 106 55 328 113 154 79 269 108 224 166 195 270 275
291 59 169 114 277 156 87 197 116 170 61 281 278 177 293
388 91 198 172 120 201 336 62 282 143 103 178 294 93 202
323 392 297 107 180 151 209 284 94 204 298 400 352 325
155 210 305 300 109 184 115 167 225 326 306 157 329 110
117 212 171 330 226 387 308 216 416 271 279 158 337 118
332 389 173 121 199 179 228 338 312 390 174 393 283 122

448 353 203 63 340 394 181 295 285 232 124 205 182 286
299 354 211 401 185 396 344 240 206 95 327 402 356 307
301 417 213 186 404 227 418 302 360 111 331 214 309 188
449 217 408 229 159 420 310 333 119 339 218 368 230 391
313 450 334 233 175 123 341 220 314 424 395 355 287 183
234 125 342 316 241 345 452 397 403 207 432 357 187 236
126 242 398 346 456 358 405 303 244 189 361 215 348 419
406 464 362 409 219 311 421 410 231 248 369 190 364 335
480 315 221 370 422 425 451 235 412 343 372 317 222 426
453 237 433 347 243 454 318 376 428 238 359 457 399 434
349 245 458 363 127 191 407 436 465 246 350 460 249 411
365 440 374 423 466 250 371 481 413 366 468 429 252 373
482 427 414 223 472 455 377 435 319 484 430 488 239 378
459 437 380 461 496 351 467 438 251 462 442 441 469 247
367 253 375 444 470 483 415 485 473 474 254 379 431 489
486 476 439 490 463 381 497 492 443 382 498 445 471 500
446 475 487 504 255 477 491 478 383 493 499 502 494 501
447 505 506 479 508 495 503 507 509 510 511].

TABLE 5

| Payload range | i | q positions | Special frozen position |
|---|---|---|---|
| 40-42 | 7 | $u_{183}, u_{215}, u_{231}, u_{247}$ | $u_{119}$ |
| 43-46 | — | — | — |
| 47-59 | 12 | $u_{188}, u_{220}, u_{236}, u_{252}$ | $u_{124}$ |
| 60-64 | 10 | $u_{186}, u_{218}, u_{234}, u_{250}$ | $u_{122}$ |
| 65-69 | 9 | $u_{185}, u_{217}, u_{233}, u_{249}$ | $u_{121}$ |
| 70-71 | 6 | $u_{182}, u_{214}, u_{230}, u_{246}$ | $u_{118}$ |
| 72-74 | 5 | $u_{181}, u_{213}, u_{229}, u_{245}$ | $u_{117}$ |

Sequence 6, N=256:
[0 1 2 4 8 16 32 3 5 64 9 6 17 10 18 128 12 33 65 20 34 24
36 7 129 66 11 40 68 130 19 13 48 14 72 21 132 35 26 80
37 25 22 136 38 96 67 41 144 28 69 42 49 74 160 192 70
44 131 81 50 73 15 133 52 23 134 76 137 82 56 27 97 39
84 138 145 29 43 98 88 140 30 146 71 161 45 100 51 148
46 75 104 162 53 193 152 77 164 54 83 57 112 135 78 194
85 58 168 139 99 86 60 89 196 141 101 147 176 142 31 200
90 149 102 105 163 92 47 208 150 153 165 106 55 113 154
79 108 224 166 195 59 169 114 156 87 197 116 170 61 177
91 198 172 120 201 62 143 103 178 93 202 107 180 151 209
94 204 155 210 109 184 115 167 225 157 110 117 212 171
226 216 158 118 173 121 199 179 228 174 122 203 63 181
232 124 205 182 211 185 240 206 95 213 186 227 111 214
188 217 229 159 119 218 230 233 175 123 220 183 234 125
241 207 187 236 126 242 244 189 215 219 231 248 190 221
235 222 237 243 238 245 127 191 246 249 250 252 223 239
251 247 253 254 255].

TABLE 6

| Payload range | i | q positions | Special frozen position |
|---|---|---|---|
| 40-44 | 30 | $u_{382}, u_{446}, u_{478}, u_{510}$ | $u_{254}$ |
| 45 | 29 | $u_{381}, u_{445}, u_{477}, u_{509}$ | $u_{253}$ |
| 45-53 | 27 | $u_{379}, u_{443}, u_{475}, u_{507}$ | $u_{251}$ |
| 54-62 | 23 | $u_{375}, u_{439}, u_{471}, u_{503}$ | $u_{247}$ |
| 63-67 | 15 | $u_{367}, u_{431}, u_{463}, u_{495}$ | $u_{239}$ |
| 68-74 | 28 | $u_{380}, u_{444}, u_{476}, u_{508}$ | $u_{252}$ |

Sequence 7, N=512:
[0 1 2 4 8 16 32 3 64 5 6 9 128 256 10 17 12 18 33 20 34
65 24 36 66 7 11 129 40 68 257 13 19 48 130 72 14 258 21
80 260 35 132 22 25 264 37 136 96 272 38 26 67 41 144 28
288 69 42 49 160 70 73 131 44 50 320 74 81 15 52 384 133
192 134 23 76 56 82 137 27 259 97 261 39 83 84 138 145 29
98 262 265 43 88 140 146 30 161 45 71 100 266 273 51 148
268 75 104 162 46 274 53 193 152 289 276 77 54 83 57 164
112 135 78 194 290 280 58 321 85 168 292 139 322 99 60

86 196 296 141 89 263 385 324 147 176 101 31 142 304 90 328 105 386 200 149 102 47 208 92 267 150 163 388 106 153 336 55 269 165 113 154 79 224 275 392 270 352 166 400 108 59 169 114 195 156 116 277 278 87 197 170 291 416 281 293 91 177 120 198 61 282 201 448 294 103 172 62 178 143 284 323 93 202 297 209 151 298 107 180 94 325 210 305 300 326 155 109 204 184 387 306 271 329 167 115 225 330 157 110 212 308 389 337 332 312 171 117 226 279 118 158 216 390 338 393 173 121 353 340 199 394 283 179 228 122 174 63 181 232 295 203 205 285 124 182 354 211 401 299 185 240 206 95 344 356 402 286 417 327 301 396 307 213 186 418 360 227 309 331 188 111 449 302 217 214 159 404 333 408 310 368 229 119 339 218 313 230 420 175 334 391 450 341 233 123 220 183 314 395 424 355 234 125 241 345 342 452 397 287 207 432 316 357 403 236 187 346 398 361 126 242 456 405 215 189 244 358 303 362 464 419 406 348 248 219 409 311 421 369 190 231 480 335 410 425 370 315 221 422 364 235 317 451 343 412 222 433 453 372 237 426 243 454 347 376 428 457 318 359 245 127 238 465 434 399 458 363 349 407 436 246 350 249 460 411 365 440 371 481 250 423 466 413 366 468 191 482 427 373 252 414 374 472 377 455 429 223 484 435 430 319 378 459 239 437 488 461 380 247 467 438 441 462 351 469 367 442 251 470 415 496 483 444 473 375 253 254 485 431 474 379 486 489 476 381 439 490 463 382 497 443 492 498 471 445 255 500 446 475 487 504 477 491 478 383 493 499 494 501 447 502 505 506 479 508 495 503 507 509 510 511].

TABLE 7

| Payload range | i | q positions | Special frozen position |
|---|---|---|---|
| 40-42 | 7 | $u_{183}, u_{215}, u_{231}, u_{247}$ | $u_{119}$ |
| 43-48 | — | — | — |
| 49-58 | 12 | $u_{188}, u_{220}, u_{236}, u_{252}$ | $u_{124}$ |
| 59-65 | 10 | $u_{186}, u_{218}, u_{234}, u_{250}$ | $u_{122}$ |
| 66-69 | 9 | $u_{185}, u_{217}, u_{233}, u_{249}$ | $u_{121}$ |
| 70-73 | 6 | $u_{182}, u_{214}, u_{230}, u_{246}$ | $u_{118}$ |
| 74 | 5 | $u_{181}, u_{213}, u_{229}, u_{245}$ | $u_{117}$ |

Sequence 8, N=256:
[0 1 2 4 8 16 32 3 64 5 6 9 128 10 17 12 18 33 20 34 65 24 36 66 7 11 129 40 68 13 19 48 130 72 14 21 80 35 132 22 25 37 136 96 38 26 67 41 144 28 69 42 49 160 70 73 131 44 50 74 81 15 52 133 192 134 23 76 56 82 137 27 97 39 84 138 145 29 98 43 88 140 146 30 161 45 71 100 51 148 75 104 162 46 53 193 152 77 54 83 57 164 112 135 78 194 58 85 168 139 99 60 86 196 141 89 147 176 101 31 142 90 105 200 149 102 47 208 92 150 163 106 153 55 165 113 154 79 224 166 108 59 169 114 195 156 116 87 197 170 91 177 120 198 61 201 103 172 62 178 143 93 202 209 151 107 180 94 210 155 109 204 184 167 115 225 157 110 212 171 117 226 118 158 216 173 121 199 179 228 122 174 63 181 232 203 205 124 182 211 185 240 206 95 213 186 227 188 111 217 214 159 229 119 218 230 175 233 123 220 183 234 125 241 207 236 187 126 242 215 189 244 248 219 190 231 221 235 222 237 243 245 127 238 246 249 250 191 252 223 239 247 251 253 254 255].

It should be noted that sequence 3 to 8 are nested sequences, i.e. the order in a sequence of length N/2 is same as the order of same elements in a sequence of length N. in this application, sequence 3 and sequence 4 are nested. Sequence 5 and sequence 6 are nested. Sequence 7 and sequence 8 are nested.

It should be noted that the q bit set is from information set. The q bit set may depend on the polar construction sequence and payload size. For sequence 3, 5, 7 shown above, they are corresponding to the same q positions and same special frozen index as shown in Table 1. For sequence 4, 6, 8 shown above, the q positions and special frozen index are shown in Table 8-10 respectively.

TABLE 8

(for sequence 4):

| Payload range | q positions (for N = 256) | Special frozen index (for N = 256) |
|---|---|---|
| 40-73 | $u_{127}, u_{191}$ | $u_{63}$ |
| 74 | $u_{126}, u_{190}$ | $u_{62}$ |

TABLE 9

(for sequence 6):

| Payload range | q positions (for N = 256) | Special frozen index (for N = 256) |
|---|---|---|
| 40-62 | $u_{127}, u_{191}$ | $u_{63}$ |
| 63-74 | $u_{126}, u_{190}$ | $u_{62}$ |

TABLE 10

(for sequence 8):

| Payload range | q positions (for N = 256) | Special frozen index (for N = 256) |
|---|---|---|
| 40-63 | $u_{127}, u_{191}$ | $u_{63}$ |
| 64-74 | $u_{126}, u_{190}$ | $u_{62}$ |

It should be also noted that the tables above are just examples. For FIG. 6(b) to FIG. 6(p) and any other similar patterns, the principle to obtain the permutation matrix or permutation pattern is same.

Please note that if the q bits ($u_{j_1}, u_{j_2}, u_{j_3}, u_{j_4}$) for the first version of the encoded codeword is determined, its following three versions are correspondingly determined. For example, if the q bits ($u_{j_1}, u_{j_2}, u_{j_3}, u_{j_4}$) for the first version of the encoded codeword is (0,0,0,0), the following seven time stamps are (1,0,0,0), (0,1,0,0), (1,1,1,0), (0,0,0,1), (1,0,0,1), (0,1,0,1) and (1,1,1,1) in sequence.

Again, if a $T_u$ can be used to generate different versions of a codeword, its inverse $T_u^{-1}$ can also be used to generate different versions of a codeword. And the version sequence is also inversed with the same first version. For the example above, if $T_u^{-1}$ is used and the first version is (0,0,0,0), the following seven versions are represented by (1,1,1,1)(0,1,0,1), (1,0,0,1), (0,0,0,1), (1,1,1,0), (0,1,0,0) and (1,0,0,0) in sequence. For q=4, $T_u^{-1}=T_u^7$. In addition, for q=4, if a $T_u$ can be used to generate different versions of a codeword, $T_u^3$ and $T_u^5$ can also be used to generate different versions of a codeword.

Similarly, if a $P_x$ can be used to generate different versions of a codeword, its inverse $P_x^{-1}$ can also be used to generate different versions of a codeword. And the version sequence is also inversed with the same first version. For q=4, $P_x^{-1}=P_x^7$. In addition, for q=4, if a $P_x$ can be used to generate different versions of a codeword, $P_x^3$ and $P_x^5$ can also be used to generate different versions of a codeword.

With the above examples, it can be found that: if a $T_u$ can be used to generate different versions of a codeword, $T_u^{2i-1}$ can also be used to generate different versions of a codeword where $i \in \{1, \ldots, \beta/2\}$ and $\beta$ is the order number of $T_u$. Specially, $T_u^{-1}=T_u^{\beta-1}$. Similarly, if a $P_x$ can be used to generate different versions of a codeword, $P_x^{2i-1}$ can also be used to generate different versions of a codeword where $i \in \{1, \ldots, \beta/2\}$ and $\beta$ is the order number of $P_x$. Specially, $P_x^{-1} = P_x^{\beta-1}$.

In 912, the encoded codeword is then transmitted.

The example method in FIG. 9 is intended for illustrative purposes. Other embodiments could involve performing the illustrated operations in any of various ways, performing fewer or additional operations, and/or varying the order in which operations are performed.

In another embodiment, a non-transitory processor-readable medium stores instructions which, when executed by one or more processors, cause the one or more processors to perform a method as disclosed herein.

Figure 7:
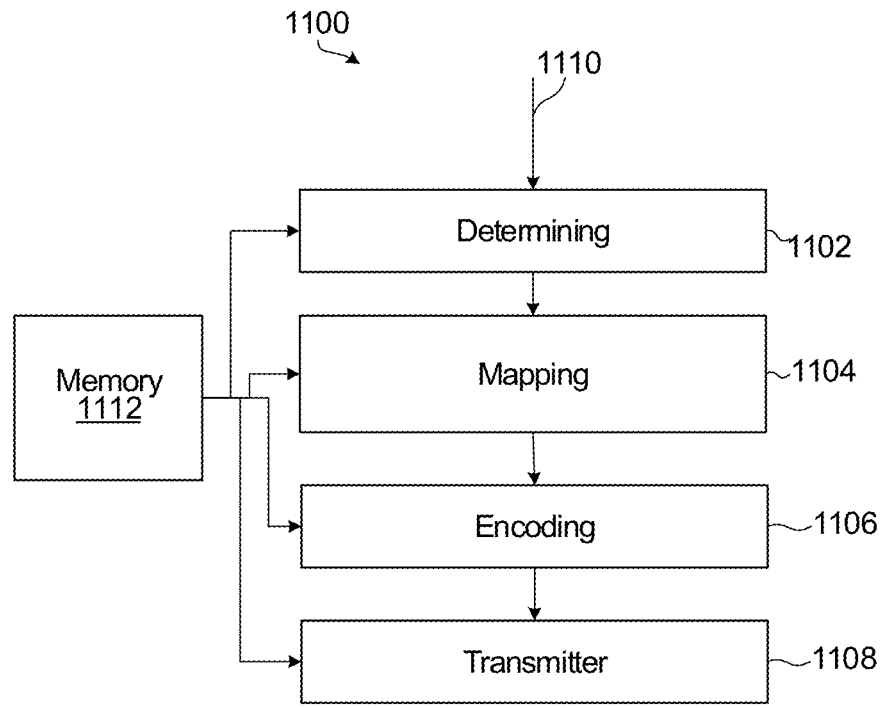
FIG. 7 is a block diagram of an apparatus for encoding and transmitting codewords.

FIG. 7 is a block diagram of an apparatus for encoding and transmitting codewords. The apparatus 1100 includes an encoding module 1106, executing the operations disclosed in step 910 in FIG. 4, coupled to a transmitter module 1108. The apparatus 1100 also includes a determining module 1102, executing the operations disclosed in step 902 and 904 in FIG. 4, coupled to a mapping module 1104, executing the operations disclosed in step 906 and 908 in FIG. 4. A memory 1112, also shown in FIG. 7, is coupled to the encoding module 1106, to the determining module 1102, and to the mapping module 1104. Although not shown, the transmitter module 1108 could include a modulator, an amplifier, antenna and/or other modules or components of a transmit chain or alternatively could be configured to interface with a separate (Radio-Frequency—RF) transmission module. For example, some of all of the modules of the apparatus 1100 may be implemented in hardware or circuitry (e.g. in one or more chipsets, microprocessors, application-specific integrated circuits (ASIC), field-programmable gate arrays (FPGAs), dedicated logic circuitry, or combinations thereof) so as to produce codewords as described herein for transmission by a separate (RF) unit.

In some embodiments, the apparatus 1100 includes a non-transitory computer readable medium at 1112, that includes instructions for execution by a processor to implement and/or control operation of the encoding module 1106, the determining module 1102, the mapping module 1104, the transmitter module 1108 in FIG. 7, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk, at 1112.

In some embodiments, the encoding module 1106 is implemented in circuitry, such as a processor, that is configured to encode input bits as disclosed herein. In a processor-based implementation of the encoding module 1106, processor-executable instructions to configure a processor to perform encoding operations are stored in a non-transitory processor-readable medium. The non-transitory medium could include, in the memory 1112 for example, one or more solid-state memory devices and/or memory devices with movable and possibly removable storage media.

The determining module 1102 could be implemented in circuitry that is configured to determine coding parameters such as mother code block length, and to determine an ordered sub-channel sequence as disclosed herein. In some embodiments, the determining module 1102 is implemented using a processor. The same processor or other circuitry, or separate processors or circuitry, could be used to implement both the encoding module 1106 and the determining module 1102. As noted above for the encoding module 1106, in a processor-based implementation of the determining module 1102, processor-executable instructions to configure a processor to perform code processing operations are stored in a non-transitory processor-readable medium, in the memory 1112 for example.

Like the encoding module 1104 and the determining module 1102, the mapping module 1104 is implemented in circuitry, such as a processor, that is configured to perform various post-encoding operations. These post-encoding operations could include rate-matching operations such as puncturing, shortening and/or interleaving, for example. In a processor-based implementation of the mapping module 1104, processor-executable instructions to configure a processor to perform post-encoding operations are stored in a non-transitory processor-readable medium, examples of which are described above. In an embodiment, the mapping module 1104 derives a puncturing or shortening scheme from a puncturing or shortening scheme that is to be applied to a codeword prior to transmission.

The apparatus 1100 could implement any of various other features that are disclosed herein. For example, the encoding module 1106, the transmitter module 1108, the determining module 1102, and/or the mapping module 1104 could be configured to implement any one or more of the features listed or otherwise described above with reference to FIG. 4.

In some alternative embodiments, the functionality of the encoding module 1106, the transmitter module 1108, the determining module 1102, and/or the mapping module 1104 described herein may be fully or partially implemented in hardware or alternatively in software, for example in modules stored in a memory such as 1112 and executed by a processor(s) of the apparatus 1100.

An apparatus could therefore include a processor, and a memory such as 1112, coupled to the processor, storing instructions which, when executed by the processor, cause the processor to perform the functionality and/or embodiments described above in relation to the encoding module 1106, the transmitter module 1108, the determining module 1102, and/or the mapping module 1104 described above.

Figure 8:
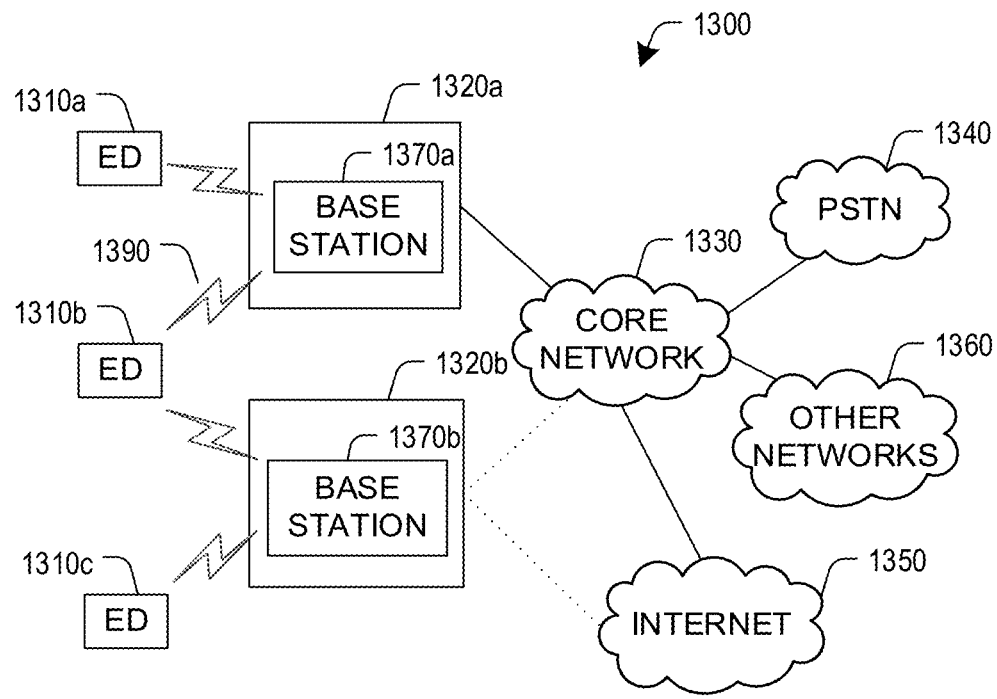
FIG. 8 is a block diagram of an example communication system in which embodiments disclosed herein may be used.

FIG. 8 illustrates an example communication system 1300 in which embodiments of the present disclosure could be implemented. In general, the system 100 enables multiple wireless or wired elements to communicate data and other content. The purpose of the system 1300 may be to provide content (voice, data, video, text) via broadcast, narrowcast, user device to user device, etc. The system 1300 may operate efficiently by sharing resources such as bandwidth.

In this example, the communication system 1300 includes electronic devices (ED) 1310*a*-1310*c*, radio access networks (RANs) 1320*a*-1320*b*, a core network 1330, a public switched telephone network (PSTN) 1340, the Internet 1350, and other networks 1360. While certain numbers of these components or elements are shown in FIG. 8, any reasonable number of these components or elements may be included in the system 1300.

The EDs 1310*a*-1310*c* and base stations 1370*a*-1370*b* are examples of communication equipment that can be configured to implement some or all of the functionality and/or embodiments described herein. For example, any one of the EDs 1310a-1310c and base stations 1370a-1370b could be configured to implement the encoding or decoding functionality (or both) described above. In another example, any one of the EDs 1310a-1310c and base stations 1370a-1370b could include the apparatus 1100 described above in relation to FIG. 7.

The EDs 1310a-1310c are configured to operate, communicate, or both, in the system 1300. For example, the EDs 1310a-1310c are configured to transmit, receive, or both via wireless or wired communication channels. Each ED 1310a-1310c represents any suitable end user device for wireless operation and may include such devices (or may be referred to) as a UE, wireless transmit/receive unit (WTRU), mobile station, fixed or mobile subscriber unit, cellular telephone, station (STA), machine type communication device (MTC), personal digital assistant (PDA), smartphone, laptop, computer, touchpad, wireless sensor, or consumer electronics device.

In FIG. 8, the RANs 1320a-1320b include base stations 1370a-1370b, respectively. Each base station 1370a-1370b is configured to wirelessly interface with one or more of the EDs 1310a-1310c to enable access to any other base station 1370a-1370b, the core network 1330, the PSTN 1340, the Internet 1350, and/or the other networks 1360. For example, the base stations 1370a-1370b may include (or be) one or more of several well-known devices, such as a base transceiver station (BTS), a Node-B (NodeB), an evolved NodeB (eNodeB), a Home eNodeB, a gNodeB (sometimes called a "gigabit" NodeB), a transmission point (TP), a site controller, an access point (AP), or a wireless router. Any ED 1310a-1310c may be alternatively or jointly configured to interface, access, or communicate with any other base station 1370a-1370b, the internet 1350, the core network 1330, the PSTN 1340, the other networks 1360, or any combination of the preceding. Optionally, the system may include RANs, such as RAN 1320b, wherein the corresponding base station 1370b accesses the core network 1330 via the internet 1350, as shown.

In the embodiment shown in FIG. 8, the base station 1370a forms part of the RAN 1320a, which may include other base stations, base station controller(s) (BSC), radio network controller(s) (RNC), relay nodes, elements, and/or devices. Any base station 1370a, 1370b may be a single element, as shown, or multiple elements, distributed in the corresponding RAN, or otherwise. Also, the base station 1370b forms part of the RAN 1320b, which may include other base stations, elements, and/or devices. Each base station 1370a-1370b may be configured to operate to transmit and/or receive wireless signals within a particular geographic region or area, sometimes referred to as a "cell." A cell may be further divided into cell sectors, and a base station 1370a-1370b may, for example, employ multiple transceivers to provide service to multiple sectors. In some embodiments a base station 1370a-1370b may establish pico or femto cells where the radio access technology supports such. In some embodiments, multiple-input multiple-output (MIMO) technology may be employed having multiple transceivers for each cell. The number of RAN 1320a-1320b shown is exemplary only. Any number of RAN may be contemplated when devising the system 1300.

The base stations 1370a-1370b communicate with one or more of the EDs 1310a-1310c over one or more air interfaces 1390 using wireless communication links e.g. RF, μWave, IR, etc. The air interfaces 1390 may utilize any suitable radio access technology. For example, the system 1300 may implement one or more channel access methods, such as code division multiple access (CDMA), time division multiple access (TDMA), frequency division multiple access (FDMA), orthogonal FDMA (OFDMA), or single-carrier FDMA (SC-FDMA) in the air interfaces 1390.

A base station 1370a-1370b may implement Universal Mobile Telecommunication System (UMTS) Terrestrial Radio Access (UTRA) to establish an air interface 1390 using wideband CDMA (WCDMA). In doing so, the base station 1370a-1370b may implement protocols such as HSPA, HSPA+ optionally including HSDPA, HSUPA or both. Alternatively, a base station 1370a-1370b may establish an air interface 1390 with Evolved UTMS Terrestrial Radio Access (E-UTRA) using LTE, LTE-A, and/or LTE-B. It is contemplated that the system 1300 may use multiple channel access functionality, including such schemes as described above. Other radio technologies for implementing air interfaces include IEEE 802.11, 802.15, 802.16, CDMA2000, CDMA2000 1x, CDMA2000 Evolution-Data Optimized (EV-DO), IS-2000, IS-95, IS-856, GSM, EDGE, and GSM EDGE radio access network (GERAN). Of course, other multiple access schemes and wireless protocols may be utilized.

The RANs 1320a-1320b are in communication with the core network 1330 to provide the EDs 1310a-1310c with various services such as voice, data, and other services. Understandably, the RANs 1320a-1320b and/or the core network 1330 may be in direct or indirect communication with one or more other RANs (not shown), which may or may not be directly served by core network 1330, and may or may not employ the same radio access technology as RAN 1320a, RAN 1320b or both. The core network 1330 may also serve as a gateway access between (i) the RANs 1320a-1320b or EDs 1310a-1310c or both, and (ii) other networks (such as the PSTN 1340, the Internet 1350, and the other networks 1360). In addition, some or all of the EDs 1310a-1310c may include functionality for communicating with different wireless networks over different wireless links using different wireless technologies and/or protocols. Instead of wireless communication (or in addition thereto), the EDs 1310a-1310c may communicate via wired communication channels to a service provider or switch (not shown), and to the internet 1350. PSTN 1340 may include circuit switched telephone networks for providing plain old telephone service (POTS). Internet 1350 may include a network of computers and subnets (intranets) or both, and incorporate protocols, such as internet protocol (IP), transmission control protocol (TCP), user datagram protocol (UDP). EDs 1310a-1310c may be multimode devices capable of operation according to multiple radio access technologies, and incorporate multiple transceivers necessary to support such.

Figure 9A:
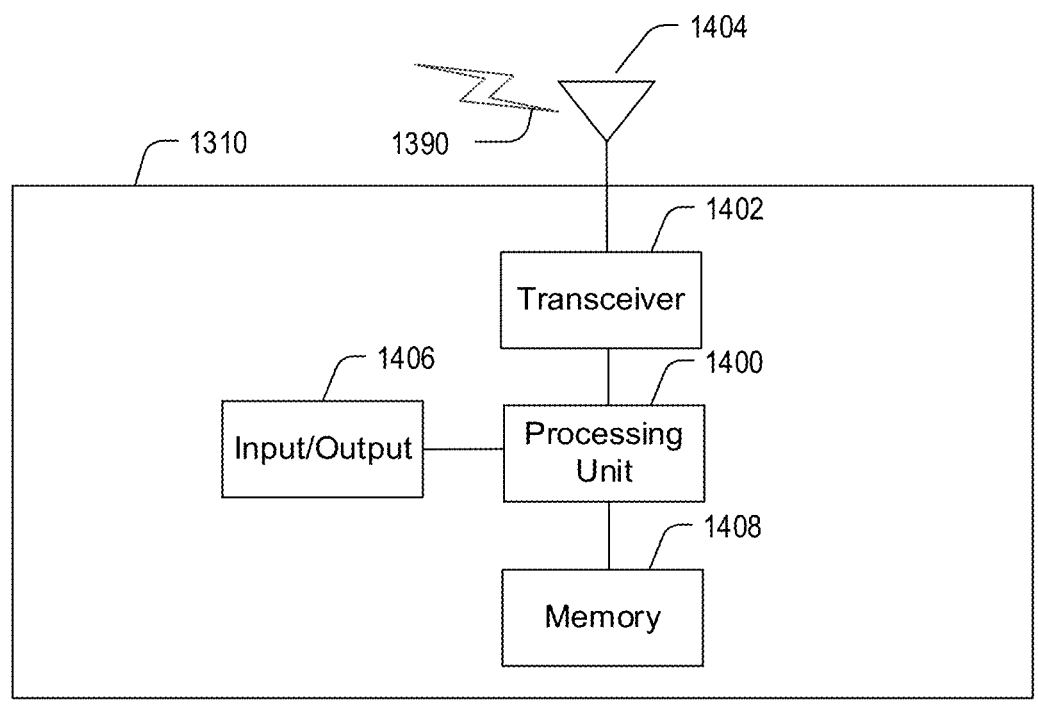
FIGS. 9A-B are block diagrams of an example ED (Electronic Device) and an example base station which may implement embodiments disclosed herein.
Figure 9B:
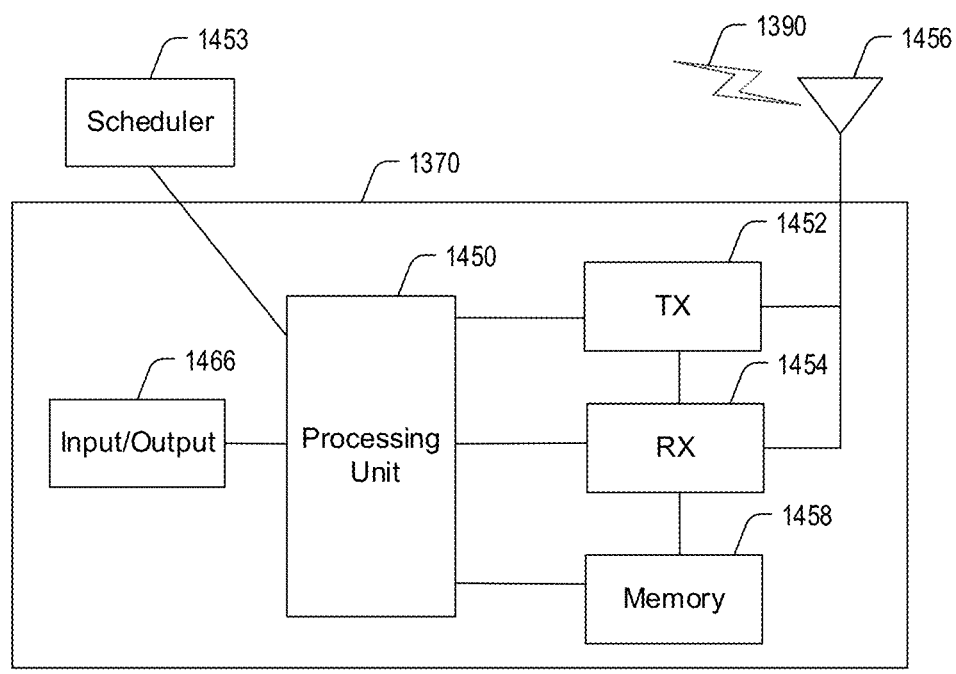

FIGS. 9A and 9B illustrate example devices that may implement the functionality and/or embodiments described above. In particular, FIG. 9A illustrates an example ED 1310, and FIG. 9B illustrates an example base station 1370. These components could be used in the system 1300 or in any other suitable system.

As shown in FIG. 9A, the ED 1310 includes at least one processing unit 1400. The processing unit 1400 implements various processing operations of the ED 1310. For example, the processing unit 1400 could perform signal coding, data processing, power control, input/output processing, or any other functionality enabling the ED 1310 to operate in the system 1300. The processing unit 1400 may also be configured to implement some or all of the functionality and/or embodiments described above, such as the steps in FIG. 4. Each processing unit 1400 includes any suitable processing or computing device configured to perform one or more operations. Each processing unit 1400 could, for example, include a microprocessor, microcontroller, digital signal processor, field programmable gate array, or application specific integrated circuit.

The ED 1310 also includes at least one transceiver 1402. The transceiver 1402 is configured to modulate data or other content for transmission by at least one antenna or network interface controller (NIC) 1404. The transceiver 1402 is also configured to demodulate data or other content received by the at least one antenna 1404. Each transceiver 1402 includes any suitable structure for generating signals for wireless or wired transmission and/or processing signals received wirelessly or by wire. Each antenna 1404 includes any suitable structure for transmitting and/or receiving wireless or wired signals. One or multiple transceivers 1402 could be used in the ED 1310, and one or multiple antennas 1404 could be used in the ED 1310. Although shown as a single functional unit, a transceiver 1402 could also be implemented using at least one transmitter and at least one separate receiver.

The ED 1310 further includes one or more input/output devices 1406 or interfaces (such as a wired interface to the internet 1350). The input/output devices 1406 facilitate interaction with a user or other devices (network communications) in the network. Each input/output device 1406 includes any suitable structure for providing information to or receiving/providing information from a user, such as a speaker, microphone, keypad, keyboard, display, or touch screen, including network interface communications.

In addition, the ED 1310 includes at least one memory 1408. The memory 1408 stores instructions and data used, generated, or collected by the ED 1310. For example, the memory 1408 could store software instructions or modules configured to implement some or all of the functionality and/or embodiments described above and that are executed by the processing unit(s) 1400. Each memory 1408 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 9B, the base station 1370 includes at least one processing unit 1450, at least one transmitter 1452, at least one receiver 1454, one or more antennas 1456, at least one memory 1458, and one or more input/output devices or interfaces 1466. A transceiver, not shown, may be used instead of the transmitter 1452 and receiver 1454. A scheduler 1453 may be coupled to the processing unit 1450. The scheduler 1453 may be included within or operated separately from the base station 1370. The processing unit 1450 implements various processing operations of the base station 1370, such as signal coding, data processing, power control, input/output processing, or any other functionality. The processing unit 1450 can also be configured to implement some or all of the functionality and/or embodiments described in more detail above, such as the steps in FIG. 4. Each processing unit 1450 includes any suitable processing or computing device configured to perform one or more operations. Each processing unit 1450 could, for example, include a microprocessor, microcontroller, digital signal processor, field programmable gate array, or application specific integrated circuit.

Each transmitter 1452 includes any suitable structure for generating signals for wireless or wired transmission to one or more EDs or other devices. Each receiver 1454 includes any suitable structure for processing signals received wirelessly or by wire from one or more EDs or other devices. Although shown as separate components, at least one transmitter 1452 and at least one receiver 1454 could be combined into a transceiver. Each antenna 1456 includes any suitable structure for transmitting and/or receiving wireless or wired signals. While a common antenna 1456 is shown here as being coupled to both the transmitter 1452 and the receiver 1454, one or more antennas 1456 could be coupled to the transmitter(s) 1452, and one or more separate antennas 1456 could be coupled to the receiver(s) 1454. Each memory 1458 includes any suitable volatile and/or non-volatile storage and retrieval device(s) such as those described above in connection to the ED 1310. The memory 1458 stores instructions and data used, generated, or collected by the base station 1370. For example, the memory 1458 could store software instructions or modules configured to implement some or all of the functionality and/or embodiments described above and that are executed by the processing unit(s) 1450.

Each input/output device 1466 facilitates interaction with a user or other devices (network communications) in the network. Each input/output device 1466 includes any suitable structure for providing information to or receiving/providing information from a user, including network interface communications.

Various embodiments disclosed herein relate to specifying sub-channel sequences using shorter ordered sequences of numbers. This could reduce memory space requirements for ordered sequence storage.

The previous description of some embodiments is provided to enable any person skilled in the art to make or use an apparatus, method, or processor readable medium according to the present disclosure.

Various modifications to the embodiments described herein may be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

For example, although embodiments are described primarily with reference to bits, other embodiments may involve non-binary and/or multi-bit symbols. If one sub-channel can transmit more than one bit, then several bits can be combined into a symbol in a defined alphabet, and a non-binary symbol is encoded for each sub-channel. Accordingly, polarization kernels are not limited to binary kernels. Symbol-level (Galois field) or non-binary kernels are also contemplated. A non-binary kernel could be preferred for its higher degree of polarization than a binary kernel. However, decoding computation complexity is higher for a non-binary kernel, because a decoder would handle symbols rather than bits.

Non-binary kernels possess characteristics of binary kernels. Furthermore, non-binary kernels could be combined or cascaded with binary kernels to form one polar code. Although the Arikan 2-by-2 binary kernel is used herein as an example, disclosed features may be extended to other types of polarization kernels.

The present disclosure refers primarily to a 2-by-2 kernel as example to demonstrate and explain illustrative embodiments. However, it is understood that the techniques for selecting sub-channels as disclosed herein could be applied to other types of polarization kernels as well, such as non-two prime number dimension kernels, non-primary dimension kernels, and/or higher dimension kernels formed by a combination of different (primary or non-primary) dimensions of kernels.

As noted above, polar codes have been selected for uplink and downlink eMBB control channel coding for the new 5G air interface, also known as the new 5G NR. The techniques disclosed herein could be used not only for control data over a control channel but also or instead other types of data (e.g. user data) over any type of channel (e.g. a data channel).

Illustrative examples described herein refer to sub-channel sequences that are in increasing order of a reliability metric. In other embodiments, ordered sequences that are in decreasing reliability order could be used. Similarly, sequences could be generated in increasing order of reliability rather than starting with more reliable channels and building a sequence by adding sub-channels with progressively decreasing reliabilities.

The invention claimed is:

1. A polar encoding method comprising:
    mapping q bits to q positions of q sub-channels, wherein q is a positive integer and the q bits indicate one or more versions of an encoded codeword;
    mapping a value 1 to a special frozen bit corresponding to the q bits;
    mapping K−q information bits to K−q positions for the K−q information bits, wherein K is an integer greater than q; and
    performing polar encoding over an input vector $u_0^{N-1}$, comprising the q bits, the special frozen bit and the K−q information bits, wherein the input vector $u_0^{N-1}$ has a length of N, with N being an integer greater than or equal to K, wherein the version of the encoded codeword is one of the following:
    $c_0^{N-1}$, $u_0^{N-1} \cdot T_u \cdot G_2^{\otimes m}$, $u_0^{N-1} \cdot T_u^2 \cdot G_2^{\otimes m}$, $u_0^{N-1} \cdot T_u^3 \cdot G_2^{\otimes m}$, $c_0^{N-1} \cdot P_x$, $c_0^{N-1} \cdot P_x^2$, and $c_0^{N-1} \cdot P_x^3$;
    wherein $c_0^{N-1} = u_0^{N-1} \cdot G_2^{\otimes m}$, $G_2^{\otimes m}$ is the m-th Kronecker power of $G_2$ matrix $$\begin{bmatrix} 1 & 0 \\ 1 & 1 \end{bmatrix},$$

m is a positive integer greater than 2, $T_u$ is a sparse upper-triangular two diagonal matrix and $T_u$ is defined as:

$$T_u = [t_{i,j}]_{i,j=0}^{N-1},$$

$$t_{i,j} = \begin{cases} 1, & i = j \text{ or } j - i = \dfrac{N}{4}, \\ 0, & \text{otherwise,} \end{cases}$$

and permutation matrix $P_x$ satisfies $$P_x = G_2^{\otimes m} \cdot T_u \cdot G_2^{\otimes m}.$$

2. The polar encoding method as in claim 1, wherein q=2.

3. The polar encoding method as in claim 2, wherein the q bits are used to indicate 1 to 4 versions of the encoded codeword.

4. The polar encoding method of claim 1, wherein a position $j_0$ of the special frozen bit in the input vector $u_0^{N-1}$ is at an index in the set $\{0, 1, \ldots, N/2-1\}$, and the q positions $j_1$ and $j_2$ for the q bits $(u_{j_1}, u_{j_2})$ are $j_1 = j_0 + N/4$ and $j_2 = j_0 + N/2$.

5. The polar encoding method of claim 1, wherein q=4.

6. The polar encoding method of claim 5, wherein the q bits are used to indicate 1 to 8 versions of the encoded codeword.

7. The polar encoding method of claim 1, wherein a position $j_0$ of the special frozen bit in the input vector $u_0^{N-1}$ is $j_0 = i + 7 \cdot N/16$, where i is an integer within the set $\{0, 1, \ldots, N/16-1\}$, and the q positions $j_1, j_2, j_3$ and $j_4$ for the q bits $(u_{j_1}, u_{j_2}, u_{j_3}, u_{j_4})$ are: $j_1 = i + 11 \cdot N/16$, $j_2 = i + 13 \cdot N/16$, $j_3 = i + 14 \cdot N/16$, $j_4 = i + 15 \cdot N/16$.

8. The polar encoding method of claim 5, wherein the version of the encoded codeword is one of the following:
$c_0^{N-1}$, $u_0^{N-1} \cdot T_u \cdot G_2^{\otimes m}$, $u_0^{N-1} \cdot T_u^2 \cdot G_2^{\otimes m}$, $u_0^{N-1} \cdot T_u^3 \cdot G_2^{\otimes m}$, $u_0^{N-1} \cdot T_u^4 \cdot G_2^{\otimes m}$, $u_0^{N-1} \cdot T_u^5 \cdot G_2^{\otimes m}$, $u_0^{N-1} \cdot T_u^6 \cdot G_2^{\otimes m}$, $u_0^{N-1} \cdot T_u^7 \cdot G_2^{\otimes m}$, $c_0^{N-1} \cdot P_x$, $c_0^{N-1} \cdot P_x^2$, $c_0^{N-1} \cdot P_x^3$, $c_0^{N-1} \cdot P_x^4$, $c_0^{N-1} \cdot P_x^5$, $c_0^{N-1} \cdot P_x^6$, and $c_0^{N-1} \cdot P_x^7$;
wherein $c_0^{N-1} = u_0^{N-1} \cdot G_2^{\otimes m}$, $G_2^{\otimes m}$ is the m-th Kronecker power of $G_2$ matrix $$\begin{bmatrix} 1 & 0 \\ 1 & 1 \end{bmatrix},$$

m is a positive integer greater than or equal to 4, and $T_u = [t_{i,j}]_{i,j=0}^{N-1}$ where:
    If $i \equiv j \pmod{N/16}$ then $t_{i,j} = \tau_{s,v}$, where $s = \lfloor i/16 \rfloor$, $v = \lfloor j/16 \rfloor$
    Otherwise $t_{i,j} = 0$
    wherein $T = [\tau_{s,v}]_{s,v=0}^{15}$ is defined by: $T = G_2^{\otimes 4} \cdot P \cdot G_2^{\otimes 4}$ and P is a permutation matrix of size 16 and order 8, $P_x = G_2^{\otimes m} \cdot T_u \cdot G_2^{\otimes m}$.

9. The polar encoding method of claim 1, wherein the $T_u$ is replaced by its inverse matrix $T_u^{-1}$, or $P_x$ is replaced by its inverse matrix $P_x^{-1}$.

10. The polar encoding method of claim 1, wherein if the q bits for a first version of the encoded codeword are fixed, then the q bits for subsequent versions are fixed given a $P_x$ or $T_u$.

11. The polar encoding method of claim 1, wherein a reliability of any of the q positions for the q bits is not less than a reliability of a position for any frozen bit.

12. The polar encoding method of claim 1, wherein the input vector $u_0^{N-1}$ comprises X special frozen bits, wherein each of the remaining X−1 special frozen bits besides the special frozen bit is set to 0 or 1, wherein X is a positive integer greater than 1.

13. A polar encoding apparatus, comprising a processor and a non-transitory computer readable medium with program instructions stored thereon, wherein executing the program instructions facilitates:
    mapping q bits to q positions of q sub-channels, wherein q is a positive integer and the q bits indicate a version of an encoded codeword;
    mapping 1 to a special frozen bit corresponding to the q bits;
    mapping K−q information bits to K−q positions for the K−q information bits, wherein K is an integer greater than q; and
    performing polar encoding over an input vector $u_0^{N-1}$, comprising the q bits, the special frozen bit and the K−q information bits, wherein the input vector $u_0^{N-1}$ has a length of N, with N being an integer greater than or equal to K, wherein the version of the encoded codeword is one of the following:
    $c_0^{N-1}$, $u_0^{N-1} \cdot T_u \cdot G_2^{\otimes m}$, $u_0^{N-1} \cdot T_u^2 \cdot G_2^{\otimes m}$, $u_0^{N-1} \cdot T_u^3 \cdot G_2^{\otimes m}$, $c_0^{N-1} \cdot P_x$, $c_0^{N-1} \cdot P_x^2$, and $c_0^{N-1} \cdot P_x^3$;

wherein $c_0^{N-1} = u_0^{N-1} \cdot G_2^{\otimes m}$, $G_2^{\otimes m}$ is the m-th Kronecker power of $G_2$ matrix $$\begin{bmatrix} 1 & 0 \\ 1 & 1 \end{bmatrix},$$

m is a positive integer greater than 2, $T_u$ is a sparse upper-triangular two diagonal matrix and $T_u$ is defined as:

$$T_u = [t_{i,j}]_{i,j=0}^{N-1},$$

$$t_{i,j} = \begin{cases} 1, & i = j \text{ or } j - i = \frac{N}{4}, \\ 0, & \text{otherwise,} \end{cases}$$

and permutation matrix $P_x$ satisfies $P_x = G_2^{\otimes m} \cdot T_u \cdot G_2^{\otimes m}$.

14. The polar encoding apparatus as in claim 13, wherein q=2.

15. The polar encoding apparatus as in claim 14, wherein the q bits are used to indicate 1 to 4 versions of the encoded codeword.

16. The polar encoding apparatus of claim 13, wherein a position $j_0$ of the special frozen bit in the input vector $u_0^{N-1}$ is at an index in the set $\{0, 1, \ldots, N/2-1\}$, and the q positions $j_1$ and $j_2$ for the q bits $(u_{j_1}, u_{j_2})$ are $j_1 = j_0 + N/4$ and $j_2 = j_0 + N/2$.

17. The polar encoding apparatus of claim 13, wherein a position $j_0$ of the special frozen bit in the input vector $u_0^{N-1}$ is $j_0 = i + 7 \cdot N/16$, where i is an integer within the set $\{0, 1, \ldots, N/16-1\}$, and the q positions $j_1, j_2, j_3$ and $j_4$ for the q bits $(u_{j_1}, u_{j_2}, u_{j_3}, u_{j_4})$ are: $j_1 = i + 11 \cdot N/16$, $j_2 = i + 13 \cdot N/16$, $j_3 = i + 14 \cdot N/16$, $j_4 = i + 15 \cdot N/16$.

18. The polar encoding apparatus of claim 17, wherein the version of the encoded codeword is one of the following:
$c_0^{N-1}$, $u_0^{N-1} \cdot T_u \cdot G_2^{\otimes m}$, $u_0^{N-1} \cdot T_u^2 \cdot G_2^{\otimes m}$, $u_0^{N-1} \cdot T_u^3 \cdot G_2^{\otimes m}$, $u_0^{N-1} \cdot T_u^4 \cdot G_2^{\otimes m}$, $u_0^{N-1} \cdot T_u^5 \cdot G_2^{\otimes m}$, $u_0^{N-1} \cdot T_u^6 \cdot G_2^{\otimes m}$, $u_0^{N-1} \cdot T_u^7 \cdot G_2^{\otimes m}$, $c_0^{N-1} \cdot P_x$, $c_0^{N-1} \cdot P_x^2$, $c_0^{N-1} \cdot P_x^3$, $c_0^{N-1} \cdot P_x^4$, $c_0^{N-1} \cdot P_x^5$, $c_0^{N-1} \cdot P_x^6$, and $c_0^{N-1} \cdot P_x^7$;

wherein $c_0^{N-1} = u_0^{N-1} \cdot G_2^{\otimes m}$, $G_2^{\otimes m}$ is the m-th Kronecker power of $G_2$ matrix $$\begin{bmatrix} 1 & 0 \\ 1 & 1 \end{bmatrix},$$

m is a positive integer greater than or equal to 4, and $T_u = [t_{i,j}]_{i,j=0}^{N-1}$ where:

If $i \equiv j \pmod{N/16}$ then $t_{i,j} = \tau_{s,v}$, where $s = [i/16]$, $v = [j/16]$ Otherwise $t_{i,j} = 0$ wherein $T = [\tau_{s,v}]_{s,v=0}^{15}$ is defined by: $T = [\tau_{s,v}]_{s,v=0}^{15}$ is defined by: $T = G_2^{\otimes 4} \cdot P \cdot G_2^{\otimes 4}$ and P is a permutation matrix of size 16 and order 8, $P_x = G_2^{\otimes m} \cdot T_u \cdot G_2^{\otimes m}$.

* * * * *